(12) United States Patent
Irshad et al.

(10) Patent No.: US 12,100,777 B2
(45) Date of Patent: *Sep. 24, 2024

(54) INTEGRATED THERMAL MANAGEMENT DEVICE WITH PV PANEL

(71) Applicant: KING FAHD UNIVERSITY OF PETROLEUM AND MINERALS, Dhahran (SA)

(72) Inventors: Kashif Irshad, Dhahran (SA); Md. Hasan Zahir, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 18/606,427

(22) Filed: Mar. 15, 2024

(65) Prior Publication Data
US 2024/0266456 A1    Aug. 8, 2024

Related U.S. Application Data

(63) Continuation of application No. 18/071,148, filed on Nov. 29, 2022, now Pat. No. 11,961,929.

(51) Int. Cl.
| | |
|---|---|
| H01L 31/0525 | (2014.01) |
| H10N 10/10 | (2023.01) |
| H10N 10/82 | (2023.01) |

(52) U.S. Cl.
CPC ......... *H01L 31/0525* (2013.01); *H10N 10/10* (2023.02); *H10N 10/82* (2023.02)

(58) Field of Classification Search
CPC ........ H10N 10/10; H10N 10/82; H02S 40/40; H02S 40/42; H02S 40/425; H01L 31/0525; H01L 31/0521
See application file for complete search history.

(56) References Cited

U.S. PATENT DOCUMENTS

| | | |
|---|---|---|
| 4,106,952 A | 8/1978 | Kravitz |
| 10,505,492 B2 | 12/2019 | Hudson et al. |

(Continued)

FOREIGN PATENT DOCUMENTS

| | | |
|---|---|---|
| CN | 104300877 B | 3/2017 |
| CN | 107275427 A | 10/2017 |

(Continued)

OTHER PUBLICATIONS

Tengfei Cui, et al., "Design of a novel concentrating photovoltaic-thermoelectric system incorporated with phase change materials", Energy Conversion and Management, vol. 112, 2016, pp. 49-60.

(Continued)

*Primary Examiner* — Andrew J Golden
(74) *Attorney, Agent, or Firm* — Oblon, McClelland, Maier & Neustadt, L.L.P.

(57) ABSTRACT

A thermal management device for a photovoltaic panel includes a phase change material layer attached to a back side of the photovoltaic panel. The thermal management device includes a Seebeck thermoelectric generator having a first surface attached to the phase change material layer. The thermal management further device includes a heat sink attached to a second surface of the Seebeck thermoelectric generator. The heat sink is configured with a sinuous coil, a water inlet port and a water outlet port connected to the sinuous coil, and a plurality of heat fins. The thermal management further device includes a casing box configured to enclose its various components, and a glass cover attached to the casing box and configured to cover a top surface of the photovoltaic panel.

17 Claims, 14 Drawing Sheets

(56) References Cited

U.S. PATENT DOCUMENTS

2011/0155214 A1   6/2011  Lam
2016/0344339 A1   11/2016 Hsieh et al.
2020/0248913 A1   8/2020  Al-Amri

FOREIGN PATENT DOCUMENTS

| CN | 109524496 A | 3/2019 |
| CN | 10-1987194 B1 | 6/2019 |
| CN | 111048614 A | 4/2020 |
| CN | 2 775 015 A1 | 7/2020 |
| CN | 113757058 A | 12/2021 |
| CN | 113871506 A | 12/2021 |
| GB | 2493092 B | 10/2018 |
| WO | WO 2009/018016 A2 | 2/2009 |

OTHER PUBLICATIONS

Md. Hasan Zahir, et al., "Shape-Stabilized Phase Change Material for Solar Thermal Energy Storage: CaO Containing $MgCO_3$ Mixed with Polyethylene Glycol", Energy & Fuels, vol. 33, Nov. 11, 2019, pp. 12041-12051.

Md. Hasan Zahir, et al., "Preparation of a Sustainable Shape-Stabilized Phase Change Material for Thermal Energy Storage Based on $Mg^{2+}$-Doped $CaCO_3$/PEG Composites", Nanomaterials, vol. 11, Issue 7, Jun. 22, 2021, pp. 1-24.

INTEGRATED THERMAL MANAGEMENT DEVICE WITH PV PANEL

CROSS-REFERENCE TO RELATED APPLICATIONS

The present application is a Continuation of U.S. application Ser. No. 18/071,148, now allowed, having a filing date of Nov. 29, 2022.

BACKGROUND

Technical Field

The present disclosure is directed to a thermal management device (TMD) for a photovoltaic panel, and a method for thermal management of the photovoltaic panel. The present disclosure is also directed to a method of assembling the thermal management device for use with the photovoltaic panel.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Many countries have committed to reducing their carbon footprint, and have proposed targets for net-zero emissions. Renewable sources of energy play a vital role for countries to achieve such targets, while helping to mitigate climate change, build resilience to volatile price changess and lower energy costs. For instance, Saudi Arabia is committed to installing 27.3 GW of renewable energy by 2023, most of which, 20 GW, will be solar photovoltaic (PV). In several of the steps taken by Saudi Arabia to utilize clean energy innovations, photovoltaic (PV) modules is one of the most popular ways to direct electrical energy using massive solar energy. As per Vision 2030, the figures will reach 40 GW for solar PV, respectively.

Some areas of the world experience high temperatures, dust and windy weather, such as is found in the desert atmosphere of Saudi Arabia. This poses great obstacles for the energy industry in trying to satisfy the rising demand for electricity. The construction market uses about half of Saudi Arabia's all-out electricity production. Moreover, over the last couple of decades, approximately 7% growth in energy usage has been reported per year (See: Alarenan, S., Gasim, A. A. and Hunt, L. C., 2020. "Modelling industrial energy demand in Saudi Arabia". Energy Economics, 85, p. 104554, incorporated herein by reference in its entirety). Abdullah City for Atomic and Green Energy (KACARE) has proposed to raise the share of renewable energy to 54 GW by 2032 with 16 GW applied to the energy mix by solar photovoltaic panels (PV). As Saudi Arabia has sunshine and has one of the highest direct normal irradiation (DNI) reception in the world, photovoltaic (PV) energy may be an excellent alternate energy source for Saudi Arabia (See: El-Assal, B., Irshad, K. and Ali, A., 2020. "Effect of Side Reflectors on the Performance of Flat Plate Solar Collector: A Case Study for Asir Region, Saudi Arabia". Arabian Journal for Science and Engineering, 45(2), pp. 1035-1050, incorporated herein by reference in its entirety). Other climatic factors such as temperature and dust, however, bring further obstacles to the current struggle to cope economically with fossil fuels except under maximum regulated conditions.

For photovoltaic panels (PV), the suggested working temperature limit ranges from −40° C. to 85° C. However, under hot and arid climates, PV temperature frequently rises above the upper limit of the temperature spectrum, resulting in temperature-induced power loss, as well as rapid degradation and PV cell delamination. Therefore, there is a significant percentage of the solar irradiance that cannot be used by a solar PV module owing to the fact that PV cell material used in a PV module have higher band gap, which will result in loss of solar energy at high heat levels. (See: Sohani, A. and Sayyaadi, H., 2020. "Employing genetic programming to find the best correlation to predict temperature of solar photovoltaic panels". Energy Conversion and Management, 224, p. 113291, incorporated herein by reference in its entirety]. The absorbed heat raised the temperature of the PV, resulting in a drop in the semiconductor band gap (See: Xu, L., Li, S., Jiang, J., Liu, T., Wu, H., Wang, J. and Li, X., 2020. "The influence of dust deposition on the temperature of soiling photovoltaic glass under lighting and windy conditions". Solar Energy, 199, pp. 491-496, incorporated herein by reference in its entirety]. PV performance differs greatly with its temperature and decreases with the increase of the PV temperature (See: Muneeshwaran, M., Sajjad, U., Ahmed, T., Amer, M., Ali, H. M. and Wang, C. C., 2020. "Performance improvement of photovoltaic modules via temperature homogeneity improvement". Energy, p. 117816, incorporated herein by reference in its entirety). The accelerated production of PVs indicates the need to utilize and further increase the performance of waste heat.

A variety of active cooling methods for PV systems have been suggested (air cooled or water cooled). Due to the amount of water required especially for wide areas, it is not sufficient to cool PVs with water. Moreover, this form of cooling device will contribute to higher costs for areas with restricted access to water. (See: Parkunam, N., Pandiyan, L., Navaneethakrishnan, G., Arul, S. and Vijayan, V., 2020. "Experimental analysis on passive cooling of flat photovoltaic panel with heat sink and wick structure". Energy Sources Part A-recovery Utilization and Environmental Effects, 42(6), pp. 653-663, incorporated herein by reference in its entirety).

A combined photovoltaic and thermoelectric (TE) generator (PV-TE) provides an efficient way of integrating broad spectrum solar electricity with cooling. A thermoelectric generator directly transforms thermal energy into electricity through the Seebeck effect as a solid state device. (See: Luo, D., Wang, R., Yu, W. and Zhou, W., 2020. "A novel optimization method for thermoelectric module used in waste heat recovery". Energy Conversion and Management, 209, p. 112645, incorporated herein by reference in its entirety). The PV-TE unit benefits from the fact that the TE generator utilizes the PV cell's surplus heat and transforms it into electricity more efficiency than the pure PV system (See: Irshad, K., Habib, K., Saidur, R., Kareem, M. W. and Saha, B. B., 2019. "Study of thermoelectric and photovoltaic facade system for energy efficient building development: A review". Journal of Cleaner Production, 209, pp. 1376-1395; and Gu, W., Ma, T., Song, A., Li, M. and Shen, L., 2019. "Mathematical modelling and performance evaluation of a hybrid photovoltaic-thermoelectric system". Energy Conversion and Management, 198, p. 111800, incorporated herein by reference in its entirety), thus a PV-TE system will provide more electricity than the PV alone.

The photovoltaic-thermoelectric hybrid device is not as robust as it seems. A difference exists between PV cell output temperature characteristics and the TE module. With the rise in temperature, the conversion output of the PV cell decreases (See: Rajaee, F., Rad, M. A. V., Kasaeian, A., Mahian, O. and Yan, W. M., 2020. "Experimental analysis of a photovoltaic/thermoelectric generator using cobalt oxide nanofluid and phase change material heat sink. Energy Conversion and Management", 212, p. 112780, incorporated herein by reference in its entirety). and the thermoelectric efficiency increases with its temperature gap (See: Kane, A., Verma, V. and Singh, B., 2017. "Optimization of thermoelectric cooling technology for an active cooling of photovoltaic panel". Renewable and Sustainable Energy Reviews, 75, pp. 1295-1305, incorporated herein by reference in its entirety). In addition, owing to the TEGs limited heat flux inputs, the output power of the TE generator is usually much lower than the PV as one inside the PV-TE coupling method (See: Liu, Z., Zhang, Y., Zhang, L., Luo, Y., Wu, Z., Wu, J., Yin, Y. and Hou, G., 2018. "Modeling and simulation of a photovoltaic thermal-compound thermoelectric ventilator system". Applied Energy, 228, pp. 1887-1900, incorporated herein by reference in its entirety).

Phase change materials (PCM) have been suggested for use in a hybrid PV-PCM system which addresses the two concerns. Via a phase shift operation, the PCM can accumulate a larger amount of latent heat than other materials. The energy storage density of the PCMs make them preferable as thermal storage systems. They are commonly used in applications for passive heat storage and temperature management (See: Ma, T., Li, Z. and Zhao, J., 2019. "Photovoltaic panel integrated with phase change materials (PV-PCM): technology overview and materials selection", Renewable and Sustainable Energy Reviews, 116, p. 109406, incorporated herein by reference in its entirety). However, this reference does not describe a practical energy storage system.

Different studies have researched thermal control techniques applied to PV in various structures. Natural cooling ventilation was described in PV systems (See: Kwan, T. H. and Wu, X., 2016. "Power and mass optimization of the hybrid solar panel and thermoelectric generators". Applied energy, 165, pp. 297-307, incorporated herein by reference in its entirety). There are other literature documents on PV topics (See: Al-Waeli, A. H., Sopian, K., Kazem, H. A. and Chaichan, M. T., 2017. "Photovoltaic/Thermal (PV/T) systems: Status and future prospects". Renewable and Sustainable Energy Reviews, 77, pp. 109-130, incorporated herein by reference in its entirety), but does not describe cooling a solar PV module. Ventilation by forced air is needed to run a fan, etc. within a solar module, (See: Fterich, M., Chouikhi, H., Bentaher, H. and Maalej, A., 2018. "Experimental parametric study of a mixed-mode forced convection solar dryer equipped with a PV/T air collector". Solar Energy, 171, pp. 751-760, incorporated herein by reference in its entirety). Both deionized immersion and jet impingement have been described for good cooling results [See: Darkwa, J. D. D. and Kokogiannakis, J. G., 2013. "Thermal management systems for photovoltaics installations". Sol Energy, 97, pp. 238-5, incorporated herein by reference in its entirety).

The above references do not describe using the excess heat stored in the PCMs. Crystalline segregation and low thermal response were recorded in PCM systems, and using fins was described to moderate the effects, (See: Hasan, A., McCormack, S. J., Huang, M. J. and Norton, B., 2010. "Evaluation of phase change materials for thermal regulation enhancement of building integrated photovoltaics". Solar Energy, 84(9), pp. 1601-1612, incorporated herein by reference in its entirety). Another experiment used PCM in a PV (BIPV) construction device, achieving a temperature drop of 18° C. for 30 minutes, (See: Ho, C. J., Tanuwijava, A. O. and Lai, C. M., 2012. "Thermal and electrical performance of a BIPV integrated with a microencapsulated phase change material layer". Energy and Buildings, 50, pp. 331-338, incorporated herein by reference in its entirety). Another experiment performed experimental and numerical assessment of a PV-PCM system cooling. Their findings revealed that the device could minimize the overall temperature of surface to around 35.6° C. relative to a non PCM assisted PV panel. Numerical results suggested that overall power out from PV panel was increased by 7.3%. (See: Stritih, U., 2016. "Increasing the efficiency of PV panel with the use of PCM". Renewable Energy, 97, pp. 671-679, incorporated herein by reference in its entirety]. In another experiment, use of a PCM cooling device with a solar PV panel improved the electrical performance by 5 percent. (See: Chandel, S. S. and Agarwal, T., 2017. Review of cooling techniques using phase change materials for enhancing efficiency of photovoltaic power systems. Renewable and Sustainable Energy Reviews, 73, pp. 1342-1351, incorporated herein by reference in its entirety). By absorbing solar irradiation, solar cell temperature rises, so solar PV panel can be a strong heat resource for TEGs.

TEGs were widely documented for implementation in many systems. The transfer performance of the hybrid system can be greatly increased by integrating photovoltaic and thermoelectric modules transforming heat into electricity. In an experimental and theoretical analysis, Dimri et al. (See: Dimri, N., Tiwari, A. and Tiwari, G. N., 2018. "Effect of thermoelectric cooler (TEC) integrated at the base of opaque photovoltaic (PV) module to enhance an overall electrical efficiency". Solar Energy, 166, pp. 159-170, incorporated herein by reference in its entirety], studied a thermoelectric photovoltaic cooler. They assessed the effect of TEC modules on the hybrid system efficiency and the use of air ducts. Likewise, ANSYS Fluent simulated a hybrid framework with a TEG and PV panel unit. Hybrid device generation was found to higher than solar PV cells without the TEG (See: Kohan, H. F., Lotfipour, F. and Eslami, M., 2018. Numerical simulation of a photovoltaic thermoelectric hybrid power generation system. Solar Energy, 174, pp. 537-548, incorporated herein by reference in its entirety]. In another analysis, three separate forms of PV units, including semitransparent, opaque and aluminum (Al) bases coupled with a TEC, were analyzed by artificial neural network and thermal models. These units, the Al base water collector PVT-TEC reported the largest total gain of energy (See: Dimri, N., Tiwari, A. and Tiwari, G. N., 2019. "Comparative study of photovoltaic thermal (PVT) integrated thermoelectric cooler (TEC) fluid collectors". Renewable Energy, 134, pp. 343-356, incorporated herein by reference in its entirety). Rodrigo et al. used passive cooling to heat-control photovoltaic-thermoelectric concentrator modules. Compared to the PV module, hybrid unit efficiency increased 2.8%. They also demonstrated that physical characteristics of the thermoelectric do not impact system efficiency and cost. (See: Rodrigo, P. M., Valera, A., Fernández, E. F. and Almonacid, F. M., 2019. "Performance and economic limits of passively cooled hybrid thermoelectric generator-concentrator photovoltaic modules". Applied energy, 238, pp. 1150-1162, incorporated herein by reference in its entirety). In one article, the ceramic platform TEC modules were removed to reduce thermal resistance in the PV-TEC device in a test to improve the efficiency of the photovoltaic thermoelectric hybrid. A V-type groove was used by the PV-TEC device to carry each PV cell to its adjacent PV cells to maximize solar irradiance. (See: Zhang, J. and Xuan, Y., 2019. "An integrated design of the photovoltaic-thermoelectric hybrid system". Solar Energy, 177, pp. 293-298]. In 2019, a mechanically and experimentally tested PVT/TEC air hybrid collector was measured. It demonstrated that thermal energy decreased, and PV energy improved as air mass transfer increased (See: Nazri, N. S., Fudholi, A., Mustafa, W., Yen, C. H., Mohammad, M., Ruslan, M. H. and Sopian, K., 2019. "Exergy and improvement potential of hybrid photovoltaic thermal/thermoelectric (PVT/TE) air collector". Renewable and Sustainable Energy Reviews, 111, pp. 132-144, incorporated herein by reference in its entirety). Cai et al. found that, with increased solar ratio and concentration, exergy destruction increased. (See: Cai, Y., Wang, W. W., Liu, C. W., Ding, W. T., Liu, D. and Zhao, F. Y., 2020. "Performance evaluation of a thermoelectric ventilation system driven by the concentrated photovoltaic thermoelectric generators for green building operations". Renewable Energy, 147, pp. 1565-1583, incorporated herein by reference in its entirety). Further, a heat sink CPV-TEG concept was suggested by Abdo et al. (See: Abdo, A., Ookawara, S. and Ahmed, M., 2019. "Performance evaluation of a new design of concentrator photovoltaic and solar thermoelectric generator hybrid system". Energy Conversion and Management, 195, pp. 1382-1401, incorporated herein by reference in its entirety). This device produced a far higher rate of thermal energy gain than conventional devices.

One study found that increasing the temperature gap between thermoelectric plates could increase the efficiency and performance of hybrid PV/T-TEG systems using PCM, as in hybrid-concentrating PV/PCM/TEC by Cui et al. [See: Cui, T., Xuan, Y. and Li, Q., 2016. "Design of a novel concentrating photovoltaic-thermoelectric system incorporated with phase change materials". Energy Conversion and Management, 112, pp. 49-60, incorporated herein by reference in its entirety]. The PCM increased the overall performance of the system by reducing differences in PV cell temperature. Using PCM, a related experimental analysis collected a PV panel's dissipated gas. Residual heat was passed to TEC units producing electricity. Using either water or air cooling processes, the TEC's residual heat capacity was reduced. 13.45% and 13.43% respectively were recorded as the electrical output and solar PV efficiency (See: Cui, T., Xuan, Y., Yin, E., Li, Q. and Li, D., 2017. "Experimental investigation on potential of a concentrated photovoltaic-thermoelectric system with phase change materials". Energy, 122, pp. 94-102]. A simulated numerical comparison of a PV/TEG/PCM vesus a PV/TEG was performed.(See: Motiei, P., Yaghoubi, M. and GoshtasbiRad, E., 2019. "Transient simulation of a hybrid photovoltaic-thermoelectric system using a phase change material". Sustainable Energy Technologies and Assessments, 34, pp. 200-213, incorporated herein by reference in its entirety). Results showed that PCM thickness could increase performance. The PV performance, PV temperature reduction and TEG performance were recorded at 0.32%, 4.61° C. and 0.06% respectively. In another study using copper and graphite foam in a concentrated hybrid PV-TE unit, it was found that although decreasing the PCM thermal resistance had no remarkable impact on PV activity, TEG efficiency would be enhanced, (See: Yin, E., Li, Q., Li, D. and Xuan, Y., 2019. "Experimental investigation on effects of thermal resistances on a photovoltaic-thermoelectric system integrated with phase change materials". Energy, 169, pp. 172-185, incorporated herein by reference in its entirety]. introduced enhanced PCMs. A computational and experimental research study established PCM features in another similar review that produced desirable photovoltaic-thermoelectric device performance. The component contained a 50 mm sheet of PCM with 5 W/m K thermal conductivity and 40-45° C. melting temperature (See: Darkwa, J., Calautit, J., Du, D. and Kokogianakis, G., 2019. "A numerical and experimental analysis of an integrated TEG-PCM power enhancement system for photovoltaic cells". Applied Energy, 248, pp. 688-701, incorporated herein by reference in its entirety).

Further, CN Publication No. 113757058A, incorporated herein by reference in its entirety, described a composite power generation system based on solar energy and a phase change heat storage device, which comprised a photovoltaic-temperature difference composite power generation device and a storage battery, wherein the photovoltaic-temperature difference composite power generation device comprises a photovoltaic solar panel, a phase change heat storage material and a temperature difference power generation assembly, the photovoltaic solar panel is connected with the storage battery through a voltage pre-charging controller, the phase change heat storage material is respectively connected with the photovoltaic solar panel and the temperature difference power generation assembly, and the temperature difference power generation assembly is connected with the storage battery through a rectifier. This reference proposes a configuration having many different components attached to each other for its operation, such as power turbine, condensers, liquid storage etc., and does not provide a closed assembly (single unit).

GB Publication No. 2493092B, incorporated herein by reference in its entirety, describes an electricity generating apparatus comprising: a photovoltaic module; a heat storage device using a phase change material; and a thermoelectric heat exchanger, Water coils passed through a PCM ball material to cool the PCM material, then the water is circulated beneath the bottom of the thermoelectric device to cool the bottom, This reference further does not provide a closed assembly (single unit).

CN Publication No. 113871506A, incorporated herein by reference in its entirety, described a photovoltaic-thermoelectricity coupling generating system based on aerogel heat insulation and phase change temperature control and working method thereof, the coupling generation system is composed of aerogel heat insulation layer, photovoltaic cell, phase change material temperature control layer, a heat insulation rotating shaft, a thermoelectric element, and a heat sink and a motor. A heat sink was connected to the bottom of the device. This device was complicated and used energy to operate the rotating shaft, plus was not integrated into a practical single assembly.

CN Publication No. 104300877B, incorporated herein by reference in its entirety, described a concentrating solar photovoltaic-thermoelectric-heat-heating integrated system, comprising: a concentrated Fresnel lens, a phase change energy storage heat exchange device for accommodating organic phase change materials, a solar arsenide battery, a thermoelectric power generation chip. This reference utilizes the concentrated Fresnel lens rather than a photovoltaic device.

The aforementioned references fail to describe a working PV/PCM module integrated with a TEG and a practical cooling module which is capable of regulating the temperature at the back of the photovoltaic panel, storing heat energy in a PCM, using the heat energy to generate electricity by the TEG, and increasing the temperature differential across the TEG to promote higher electrical production by cooling the cool side of the TEG. Further, none of the references provide a conductive layer (such as, an aluminum sheet) on a back side of photovoltaic panel to evenly distribute heat generated by the photovoltaic panel.

Accordingly, it is one object of the present disclosure to provide a practical thermal management device and a method for thermal management of the photovoltaic (PV) panel for control of PV temperatures which improves panel power output and increases the lifespan of the PV panel.

SUMMARY

In an exemplary embodiment, a thermal management device is provided. The thermal management device includes a photovoltaic panel configured to convert solar radiation to electric power. The thermal management further device includes a phase change material layer attached to a back side of the photovoltaic panel. The thermal management further device includes a Seebeck thermoelectric generator having a first surface attached to the phase change material layer. The thermal management further device includes a heat sink attached to a second surface of the Seebeck thermoelectric generator. The heat sink is configured with a sinuous coil, a water inlet port and a water outlet port connected to the sinuous coil, and a plurality of heat fins. The thermal management further device includes a casing box configured to enclose a back and sides of an assembly of the photovoltaic panel, the phase change material layer, the Seebeck thermoelectric generator and the heat sink. The thermal management further device includes a glass cover configured to cover a top surface of the photovoltaic panel. The glass cover is attached to the casing box.

In another exemplary embodiment, a method for thermal management of a photovoltaic panel is provided. The method includes generating, by the photovoltaic panel, electric power and heat from solar radiation. The method further includes storing, in a phase change material layer attached to a back side of the photovoltaic panel, the heat. The method further includes converting, by a Seebeck thermoelectric generator having a first surface attached to the phase change material layer, the heat to electricity. The method further includes cooling, by a heat sink configured with a sinuous coil and a plurality of heat fins, a second surface of the Seebeck thermoelectric generator. The second surface is opposite to the first surface.

In another exemplary embodiment, a method of assembling a thermal management device is provided. The method includes lining a bottom surface of a casing box with a phase change material liner. The method further includes installing a heat sink configured with a sinuous coil, a water inlet port and a water outlet port connected to the sinuous coil, and a plurality of heat fins inside the casing box. The method further includes installing a Seebeck thermoelectric generator having a first surface and a second surface inside the casing box. The method further includes attaching the second surface of the Seebeck thermoelectric generator to the heat sink. The method further includes covering the first surface with a phase change material layer. The method further includes covering the phase change material layer with an aluminum sheet. The method further includes installing a photovoltaic panel configured to generate electric power and heat from solar radiation over the aluminum sheet. The method further includes attaching the photovoltaic panel to a first electrical junction box. The method further includes attaching the Seebeck thermoelectric generator to a second electrical junction box. The method further includes installing a glass cover over the photovoltaic panel. The method further includes covering an outside surface of the casing box with thermal insulation.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
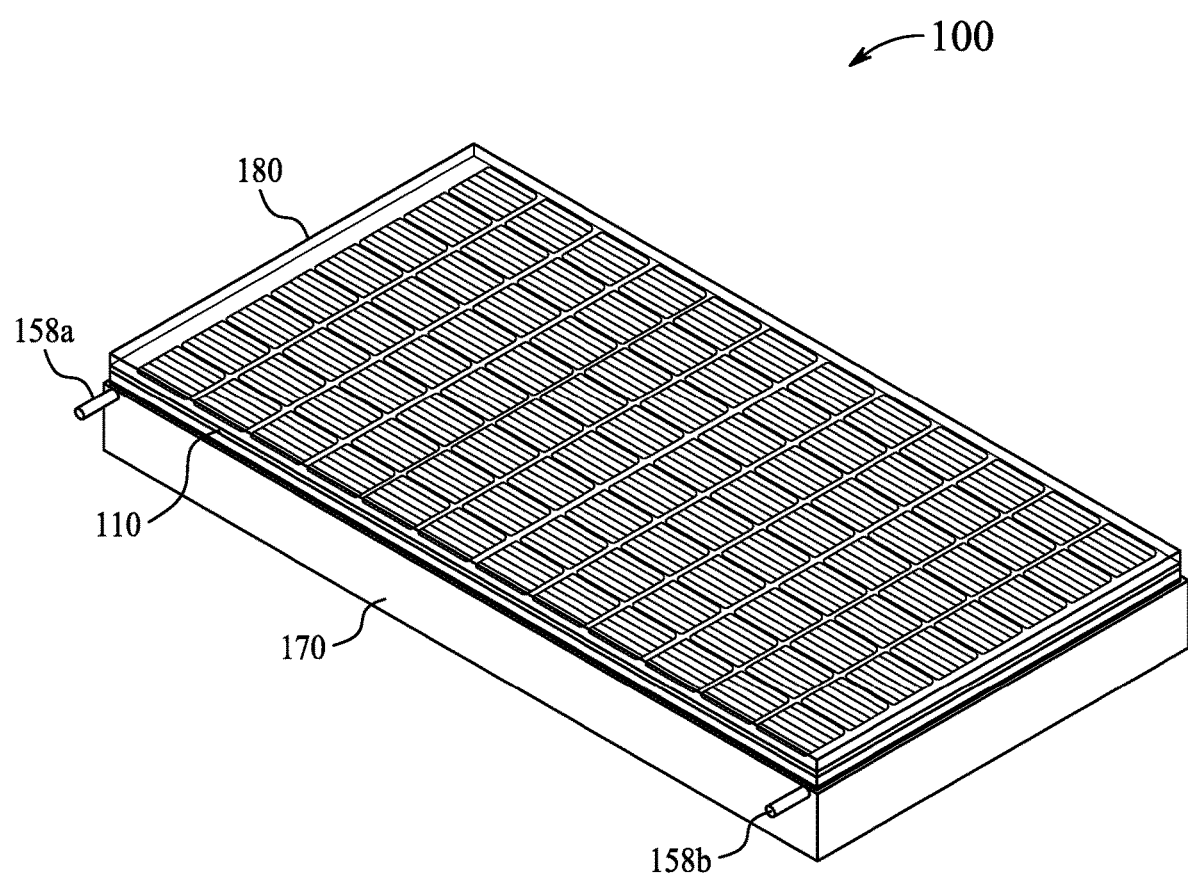
FIG. 1 is a perspective assembled diagram of a thermal management device, according to certain embodiments.

In the drawings, like reference numerals designate identical or corresponding parts throughout the several views.

Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a thermal management device (TMD) (also referred to as a Green Thermal Management System Booster (GTM Booster)) which maintains thermal operating conditions for a photovoltaic panel. The TMD boosts the generation of electricity by a photovoltaic panel by controlling the operating temperature of the photovoltaic panel. The thermal management device generates "green" energy, as no fossil fuel sources are used. The thermal management device includes combination of the photovoltaic (PV) panel with a phase change material layer including a phase change material (PCM), a Seebeck thermoelectric generator including thermoelectric generators (TEGs) and a heat sink, for conversion of waste heat into useful energy while maintaining the operating temperature within specifications required by the PV panel. The thermal management device operates under the principle that, while the PV panel uses a part of the solar spectrum to produce energy, the remainder of the spectrum of solar radiation is converted into heat and stored by the PCM, which contributes to the increase in PCM's temperature and generates a phase transition in the PCM. Herein, the thermal management device utilizes composite PCM materials which have high thermal enthalpies, good stability and preferred operational temperature ranges as compared to traditional shape-stabilized PCMs. Further, the leftover heat stored in the PCM is utilized by the TEGs to generate electricity using Seebeck principle. Eventually, remaining waste heat energy which the TEGs may not be able to use is transferred to the heat sink having a water flow system integrated therein. The temperature of water flowing through the heat sink is increased by the waste heat. Such heated water may be used in a water heater or the like for further power generation, thereby increasing overall power output. In the nighttime when solar radiation decreases, the PCM releases the stored energy by reversing the process. As the production from the solar cell is decreased during the night, the TEGs may continue to produce electricity due to the energy contained in the PCM. Herein, the PCM plays the function of heat energy storage and keeping the thermal management device running at an optimum working conditions.

The direct addition of the PCM to the PV-TEG hybrid device allows the system to operate at a lower temperature. In addition, the PV and TEG electrical performances are increased by increasing the temperature differential over the TEG, and the consumed thermal energy may be used for other purposes. The phase shift material is designed to consume significant quantities of latent heat over a relatively small temperature range. Therefore, if there is ample thermal contact between the PCM and the PV panel, a PCM-based temperature control system can keep the PV panel at near-constant temperature as the PCM absorbs waste heat from the panel and transitions operation. Via a heat exchanger, the heat energy stored in the PCM can be either removed or used for other purposes.

Figure 2:
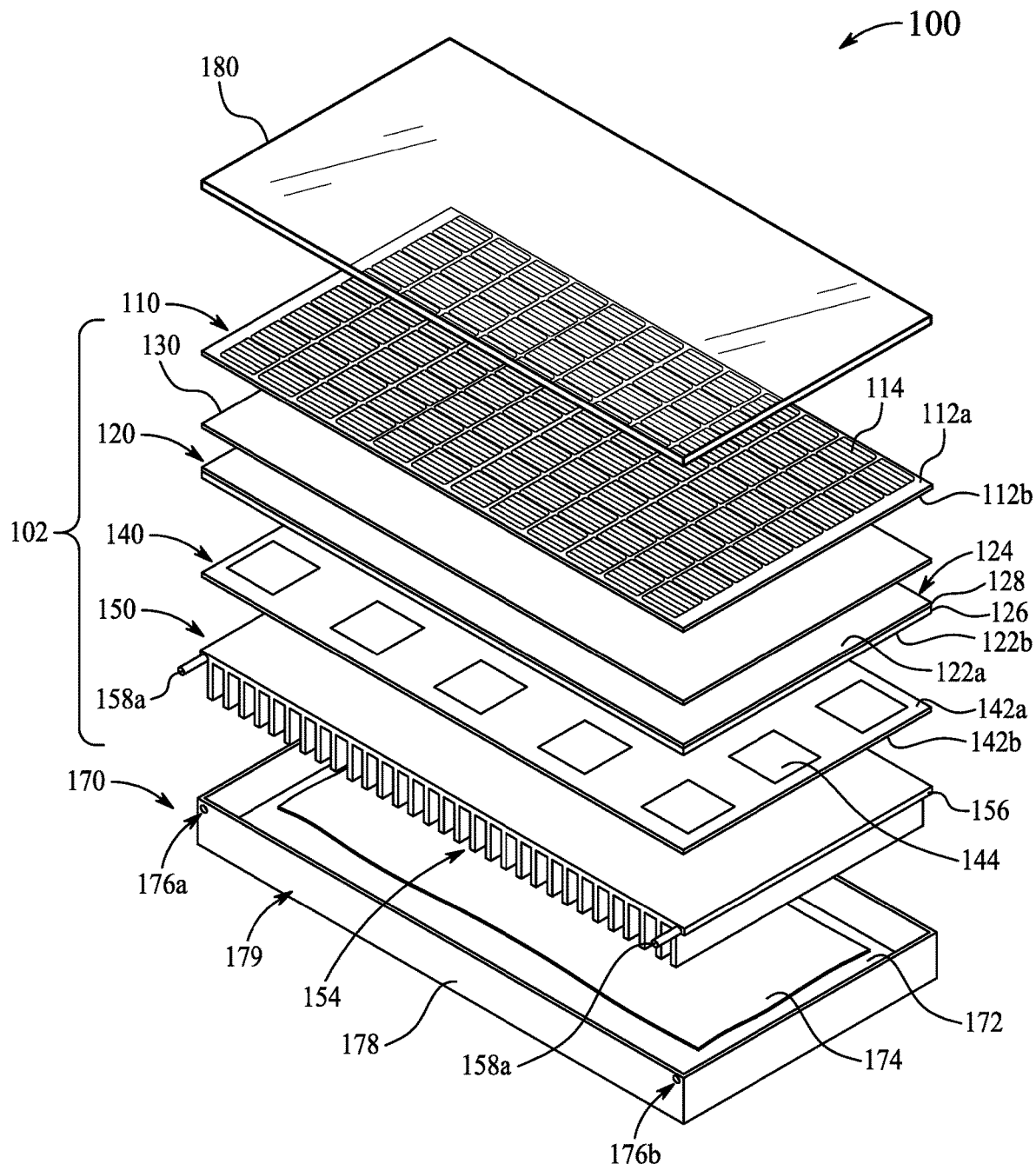
FIG. 2 is a perspective exploded diagram of the thermal management device, according to certain embodiments.

Referring to FIGS. 1 and 2, in combination, illustrated are diagrams of a thermal management device (represented by reference numeral 100). As illustrated, the thermal management device 100 includes a photovoltaic (PV) panel 110. The present disclosure has been described to have the photovoltaic panel 110 integrated with the thermal management device 100. However, in some examples, the thermal management device 100 may be adapted as a module to be removably disposed (attached) with the photovoltaic panel 110 without departing from the spirit and the scope of the present disclosure. The thermal management device 100 of the present disclosure is implemented for regulating operational conditions for the photovoltaic panel 110 by maintaining its operational temperature within operating specifications while also supplementing the photovoltaic panel 110 by additional power generation using heat absorbed therefrom, to increase overall power output and power efficiency.

As illustrated in FIG. 2, the photovoltaic panel 110 has a top surface 112a and a back side 112b. The thermal management device 100 is adapted to be installed in a manner such that the top surface 112a of the photovoltaic panel 110 is exposed to solar radiation. Herein, the top surface 112a of the photovoltaic panel 110 is provided with multiple photovoltaic cells 114, which configure the photovoltaic panel 110 to convert solar radiation to electric power. Such operation of the photovoltaic panel 110 is well known and is not described any further for brevity of the present disclosure. In the process of conversion of solar radiation to electric power, heat is generated at the back side 112b of the photovoltaic panel 110. This generated heat can increase the operational temperature of the photovoltaic panel 110 which may reduce its power output. The thermal management device 100 helps with disposing of this heat to maintain the operating temperature of the photovoltaic panel 110 within specifications (as discussed in the preceding paragraph). In an example, the photovoltaic panel 110 may be a typical 5 kW panel with dimensions of about 1 m by 1.6 m. It may be appreciated that the given panel power capacity and dimensions are exemplary only and shall not be construed as limiting to the present disclosure in any manner.

Further, as illustrated, the thermal management device 100 includes a phase change material layer 120. Herein, the phase change material layer 120 is attached to the back side 112b of the photovoltaic panel 110. In an example, the phase change material layer 120 may have same dimensions (i.e., length and width) as the photovoltaic panel 110 to be properly attached thereto. As shown, the phase change material layer 120 has a front surface 122a and a back surface 122b. Particularly, the front surface 122a of the phase change material layer 120 is arranged to be attached to the back side 112b of the photovoltaic panel 110. Herein, the phase change material layer 120 is attached to the photovoltaic panel 110 to receive and absorb the heat generated thereby.

In some aspects, the thermal management device 100 may include an aluminum sheet 130 arranged between the photovoltaic panel 110 and the phase change material layer 120. In particular, the aluminum sheet 130 is connected between the back side 112b of the photovoltaic panel 110 and the front surface 122a of the phase change material layer 120. The aluminum sheet 130 is configured to evenly distribute the heat generated by the photovoltaic panel 110. In an example, the aluminum sheet 130 may, generally, have the same dimensions (i.e., length and width) as the photovoltaic panel 110 and the phase change material layer 120 to be able to be properly attached to and collect the heat generated by the photovoltaic panel 110, and further evenly distribute the collected heat to the phase change material layer 120.

In the present disclosure, the phase change material layer 120 is configured to store the heat. In particular, as shown in FIG. 2, the phase change material layer 120 includes a copper housing 124. In an example, the copper housing 124 may be the form of an open tray having an outside surface 126 defined by its vertical extending side walls. In some examples, the outside surface 126 of the copper housing 124 may be surrounded by thermal insulation (not shown). The phase change material layer 120 further includes a phase change material 128 configured to line an inside of the copper housing 124. The phase change material 128 may be lined in the inside of the copper housing 124 to cover entire surface area thereof to evenly receive the heat from the back side 112b of the photovoltaic panel 110 (via the aluminum sheet 130). Specifically, the PCM 128 may fill the copper housing 124 which is wrapped with the thermal insulation, and the phase change material layer 120 may be attached directly to the back side 112b of the photovoltaic panel 110 or indirectly via the aluminum sheet 130, by a thermally conductive adhesive. It may be understood that the phase change material 128 stores the heat in the phase change material layer 120. In the phase change material layer 120, the thermal insulation on the outside surface 126 of the copper housing 124 helps to prevent or minimize loss of heat from the phase change material 128 in the inside of the copper housing 124.

In an aspect, the phase change material layer 120 is composed of a mixture of polyethylene glycol (PEG) and magnesium carbonate ($MgCaCO_3$) dissolved in ethanol. More specifically, the phase change material (PCM) 128 lining the inside of the copper housing 124 is composed of a mixture of polyethylene glycol (PEG) and magnesium carbonate ($MgCaCO_3$) dissolved in ethanol. The PEG/$MgCaCO_3$ composite PCM 128 may be synthesized by dissolving 0.5 g of PEG-6000 and 0.2 g of $MgCaCO_3$ in 50 mL of ethanol with stirring for about 30 minutes to mix the organic polymer and inorganic support well and allowing further dissolution by sonication for 30 minutes. The PCM 128 may be isolated by allowing the ethanol to evaporate at 80° C. for 24 hours with stirring. This method of synthesizing the PCM 128 provides a porous material containing a combination of alkaline earth metal ions, i.e., Mg (10 mol %) doped-$CaCO_3$ (hereinafter, referred to as P-10-MCC PCM), as may be synthesized using a simple hydrothermal process, and addresses a range of PCM technology issues, including the synthesis of significant amounts of support materials at a low cost using simple techniques.

The P-10-MCC PCM 128 has a superior latent heat, larger storage capacity, and low supercooling compared to other known composites, such as P-5-MCC and P-15-MCC PCMs. The P-10-MCC shape-stabilized composite PCM 128 displays reproducible behavior and retains the ability to store and release energy without a significant change even after 200 thermal heating and cooling cycles. The cost of production of the present shape-selective P-10-MCC PCM 128 is significantly lower than that of materials prepared using conventional inorganic/organic microencapsulation, as the proposed process uses widely available and low-cost materials (MgO, $CaCO_3$, and PEG). The materials used in the process are also of a comparatively low cost ($CaCO_3$: US$80/ton; $MgCO_3$: US$620/ton). Polyethylene glycol as used in the PCM 128 is also of a very low cost (US$1.85/kg) compared to US$60.00 for 100 g of palmityl alcohol commonly used as an organic PCM. The P-10-MCC PCM 128 also has a good odor and does not undergo sublimation during melting. Hence, the present P-10-MCC PCM 128 may also be a potential candidate for ensuring comfort within buildings.

The advantages of the present PCM 128 includes innovative product design (no similar product available in the market), suitable working temperature range (35-60° C.) for hot conditions, high conductivity which enhances charge/discharge rate, no leakage which solves melting issues, high stability (thermal and chemical), low volume expansion, high latent heat (high energy storage capacity), and so on. Table 1 below provides a comparative analysis of present composite PCM 128 (listed in row 1) with commercially available PCM products (listed in rows 2 to 6).

TABLE 1

Comparative analysis of present composite PCM with commercial PCM product

| S No. | Sample | Melting Point (° C.) | Latent Heat [$\Delta H_m$(J/g)] | Heat Conductivity (W/mK) | Volume Expansion | Thermal Stability |
|---|---|---|---|---|---|---|
| 1 | P-10-MCC PCM | 36-55 | 152.5 | 0.54 | 5% | 200 Thermal Cycle |
| 2 | PCM-RT42(Paraffin Based) [Commercial Product] | 38-42 | 147.5 | 0.2 | 12.5% | 100 Thermal Cycle |
| 3 | PCM-Paraffin (Perlite/CNT-0.5%) | 38.43 | 156.02 | 0.24 | 13.4% | 100 Thermal Cycle |
| 4 | PCM- Polyethylene glycol/perlite/CNT (0.5%) | 35-59 | 142 | 0.45 | 5% | 200 Thermal Cycle |
| 5 | Commercial Paraffin Waxes | 20-70 | 120 | 0.20 | Large volume change | 100 Thermal Cycle |
| 6 | $RT_3HC_1$ | 25-65 | 190 | 0.20 | Large volume change | 100 Thermal Cycle |

Further, as illustrated in combination of FIGS. 1 and 2, the thermal management device 100 also includes a Seebeck thermoelectric generator 140. As shown, the Seebeck thermoelectric generator 140 has a first surface 142a and a second surface 142b. The Seebeck thermoelectric generator 140 is attached to the phase change material layer 120. In particular, the first surface 142a of the Seebeck thermoelectric generator 140 is attached to the phase change material layer 120. In the thermal management device 100, the Seebeck thermoelectric generator 140 is configured to receive the heat stored in the phase change material 128 at the first surface 142a and convert the heat to electricity by utilizing a temperature gradient between the first surface 142a and the second surface 142b. Herein, the second surface 142b is opposite to the first surface 142a. As illustrated, the present Seebeck thermoelectric generator 140 utilizes multiple thermoelectric generators (TEGs) 144. In the Seebeck thermoelectric generator 140, the TEGs 144 provide capacity to transform heat (thermal energy) into electricity through the Seebeck effect. Specifically, the heat stored by the PCM 128 in the phase change material layer 120 is passed to the TEGs 144 in the Seebeck thermoelectric generator 140 for electricity generation, by using the Seebeck principle. In an example, the TEG 144 may be of dimension 40 mm long, 40 mm wide and 4 mm thick, and made up of bulk bismuth telluride (Bi2Te3) alloys and two isolated ceramic layers. It may be understood that the Seebeck thermoelectric generator 140 may be so arranged in the thermal management device 100 to have an upper hot side of the TEGs 144 to be in contact with the phase change material layer 120, and to have a cool side of the TEGs to be contact with heat dissipation source (such as a heat sink, as discussed in the below). The operation of TEGs for generation of electricity using thermal energy is well known in the art and thus not described herein for brevity of the present disclosure.

Furthermore, as illustrated, the thermal management device 100 includes a heat sink 150. The heat sink 150 is attached to the Seebeck thermoelectric generator 140. In particular, the heat sink 150 is attached to the second surface 142b of the Seebeck thermoelectric generator 140. As shown in the illustrated examples, the heat sink 150 may, generally, be in the form of a block attached to the second surface 142b of the Seebeck thermoelectric generator 140 by a thermally conductive adhesive. The heat sink 150, as generally known in the art, is employed as a passive heat exchanger that transfers the heat that may not be utilized by the Seebeck thermoelectric generator 140 to a fluid medium (water in present examples, as discussed later in more detail), where the heat is dissipated away by the heat sink 150, thereby allowing regulation of temperature of other components in the thermal management device 100.

Figure 3A:
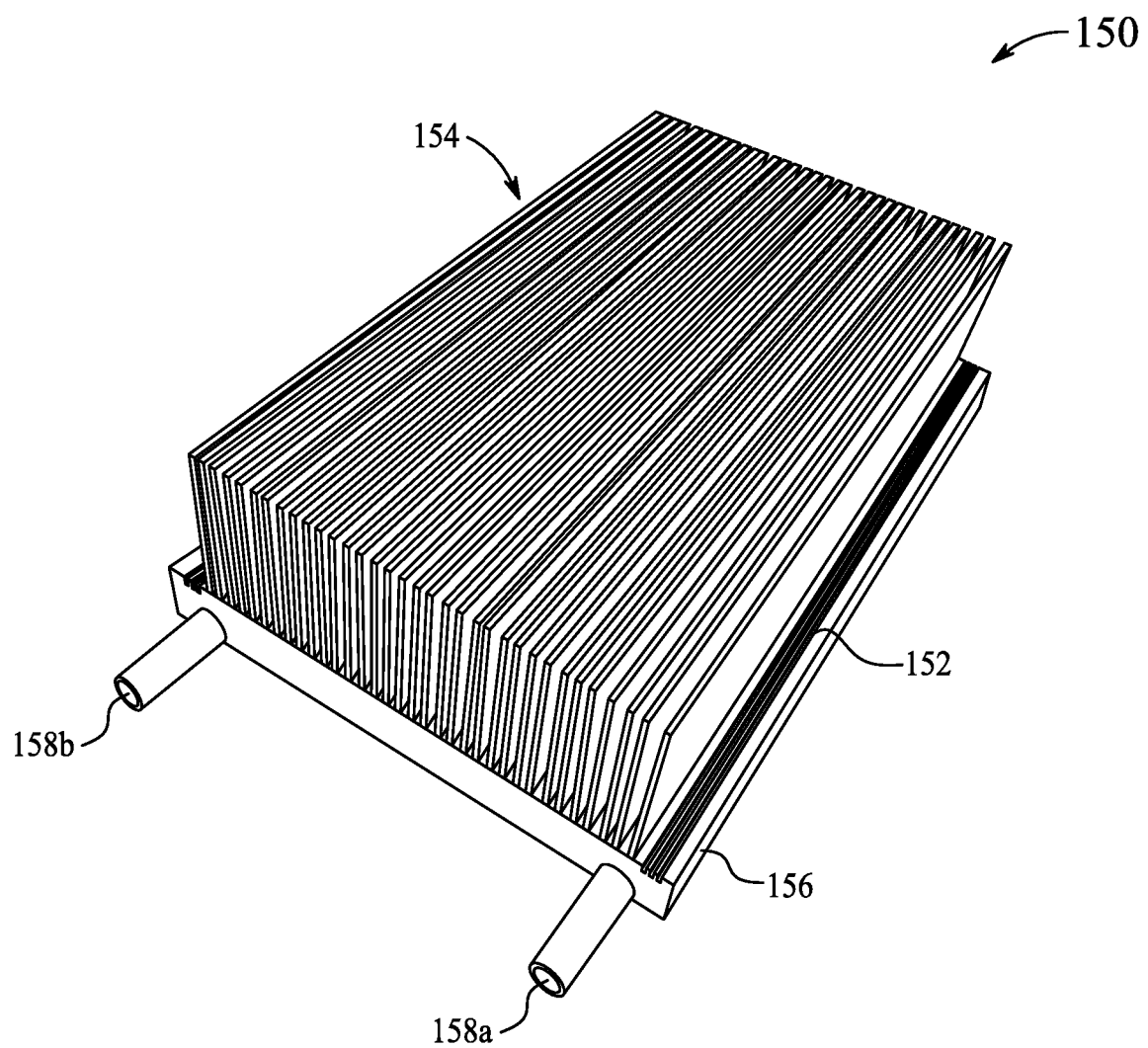
FIG. 3A is a bottom perspective diagram of a heat sink for the thermal management device, according to certain embodiments.
Figure 3B:
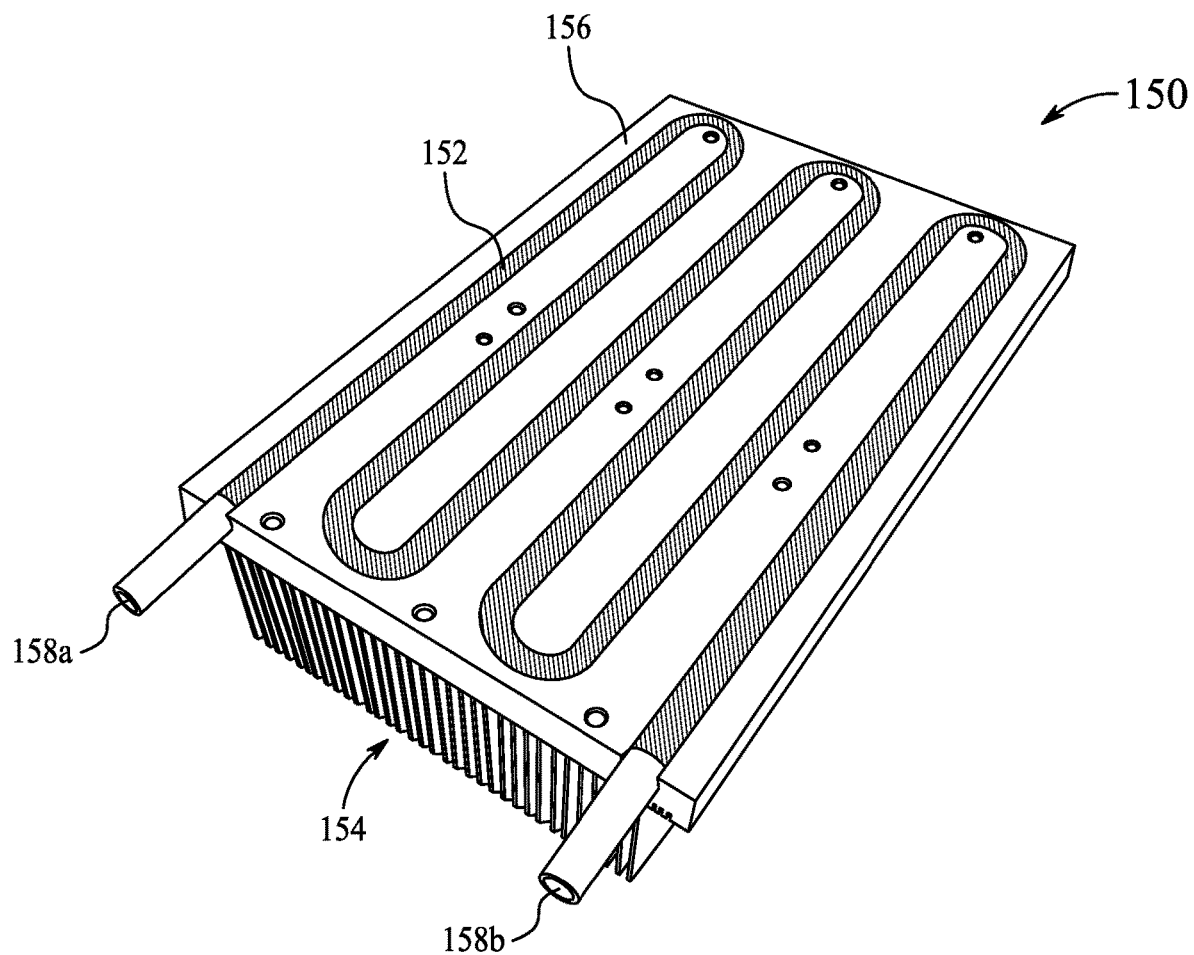
FIG. 3B is a top perspective diagram of a heat sink for the thermal management device, according to certain embodiments.

Referring to FIGS. 3A and 3B, in combination, illustrated are diagrams of the heat sink 150 depicting details thereof. In the present example, as shown, the heat sink 150 is configured with a sinuous coil 152 and a plurality of heat fins 154. In particular, the heat sink 150 includes a plate 156 which, in turn, includes the sinuous coil 152. As shown, the sinuous coil 152 may be disposed inside the plate 156. As used herein, the sinuous coil 152 may be a coil with multiple curves to allow for increasing its surface area which allows for the water flowing inside thereof to collect more heat and thereby maximize heat transfer. Further, the plurality of heat fins 154 are arranged to extend perpendicularly from the plate 156. Referring back to FIG. 2, as shown, the heat sink 150 is so disposed in the thermal management device 100 that the plate 156 is in contact with the second surface 142b of the Seebeck thermoelectric generator 140 so as to extract the heat therefrom, which may be collected by the water flowing inside the sinuous coil 152, and then may be dissipated by the plurality of heat fins 154 to the ambient atmosphere. In some examples, rather than dissipating the said extra heat to the ambient atmosphere, the heat sink 150 may re-circulate (for example, to the TEGs 144 when able to use heat for electricity generation) and/or transfer (for example, by an external heat pump) the heated water to be further utilized for power generation, to further increase efficiency of the present the thermal management device 100. Such proposed implementations may be contemplated by a person skilled in the art, and are thus not explained in further detail for brevity of the present disclosure.

In present examples, the heat sink 150 may be made of aluminum to provide high heat transfer capability. It may be contemplated that the heat sink 150 may have multiple independent geometric parameters that may be varied in design, such as, fin thickness, fin height, fin length, fin spacing, base length, base width, thickness of the plate 156, etc. In a non-limiting example, the heat sink 150 may have a fin pitch varying between 0.8 mm and 3.0 mm, fin height may vary between 20 mm to 100 mm, fin length may vary between 75 mm to 300 mm, and the like. In some examples, the heat sink 150 may also be provided with a fan (not shown) to radiate the heat through the plurality of heat fins 154 from the heat sink 150. Additionally, or alternatively, the heat sink 150 may be provided with an exit port (nor shown) to remove the waste heat therefrom.

Figure 4:
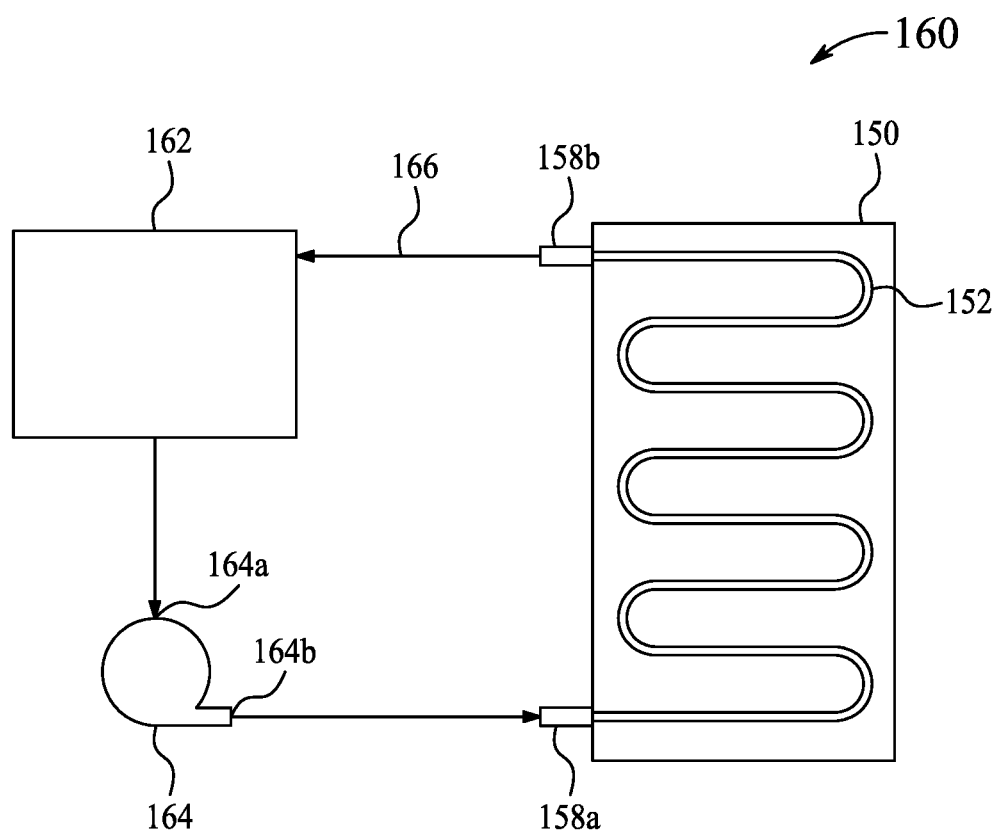
FIG. 4 is a schematic diagram of a water circuit associated with the heat sink for the thermal management device, according to certain embodiments.

Further, as shown in FIGS. 1, 3A and 3B, for providing a flow of water to the sinuous coil 152, the heat sink 150 is further configured with a water inlet port 158a and a water outlet port 158b connected to the sinuous coil 152. It may be appreciated that the water inlet port 158a and the water outlet port 158b may be provided along any of one or more sides (edges) of the plate 156 of the heat sink 150 without any limitations, and the illustrated configuration(s) are exemplary only. Referring to FIG. 4, illustrated is a schematic of a water circuit 160 associated with the heat sink 150 of the thermal management system 100 to provide flow of water thereto. As shown, the water circuit 160 includes a water reservoir 162 which may be configured to hold a supply of water. The water circuit 160 also includes a water pump 164 having a first end 164a and a second end 164b. The water pump 164 is connected at the first end 164a to the water reservoir 162 and at the second end 164b to the water inlet port 158a of the heat sink 150. Further, the water circuit 160 includes a water pipe 166 connected to the water outlet port 158b of the heat sink 150. The water pump 164 is configured to pump water from the water reservoir 162, through the sinuous coil 152 and back to the water reservoir 162, via the water pipe 166. This way, the water circuit 160 ensures the flow of water in the heat sink 150 for allowing heat transfer thereby.

Referring again to FIGS. 1 and 2, the thermal management system 100 may also include a casing box 170. In an example, the casing box 170 is made of aluminum. The casing box 170 is configured to enclose a back and sides of an assembly 102 of the photovoltaic panel 110, the phase change material layer 120, the Seebeck thermoelectric generator 140 and the heat sink 150. Thereby, the present thermal management system 100 has an integrated and closed assembly. In the present examples, the casing box 170 may be in the form of a tray with a bottom side providing a bottom surface 172 and vertical extending side walls 178, which together define an outside surface 179 for the casing box 170, with sufficient corresponding dimensions (slightly greater than the dimensions of the photovoltaic panel 110) to be able to enclose the back and sides of the assembly 102. Further, as shown, the casing box 170 may be provided with holes or slots 176a, 176b in one or more of the side walls 178, which may be complementary to the water inlet port 158a and the water outlet port 158b of the heat sink 150, to allow for the water inlet port 158a and the water outlet port 158b to extend outside of the casing box 170, in order to be disposed in connection with the water circuit 160 (as discussed above).

In some examples, the bottom surface 172 of the casing box 170 includes a phase change material liner 174. In the present examples, the phase change material liner 174 may made of same phase change material 128 as in the phase change material 120. For instance, the phase change material liner 174 may also be made by dissolving a mixture of polyethylene glycol (PEG) and magnesium carbonate ($MgCaCO_3$) in ethanol and solidifying the mixture by evaporation. The phase change material liner 174 may be utilized for removing heat from the plurality of heat fins 154 by storing heat therein. Thereby, instead of dissipating the heat to the ambient atmosphere by the plurality of heat fins 154, the phase change material liner 174 can potentially be used to store heat temporarily, which in turn may be utilized for energy generation, for instance, by transferring back the heat to the TEGs 144 in the Seebeck thermoelectric generator 140 during nighttime use.

Further, as illustrated, the thermal management device 100 includes a glass cover 180. The glass cover 180 is configured to cover the top surface 112*a* of the photovoltaic panel 110. Herein, the glass cover 180 is attached to the casing box 170. Thus, the glass cover 180 fully encloses the assembly 102 of the photovoltaic panel 110, the phase change material layer 120, the Seebeck thermoelectric generator 140 and the heat sink 150, protecting these components from external environment. In some examples, the glass cover 180 may be made of material to allow for blocking of a spectrum of solar radiation which may heat up the photovoltaic panel 110, while allowing for passing of a spectrum of solar radiation which may be used for the photovoltaic panel 110 for conversion to electric power, thus minimizing of temperature rise of the photovoltaic panel 110.

Figure 5A:
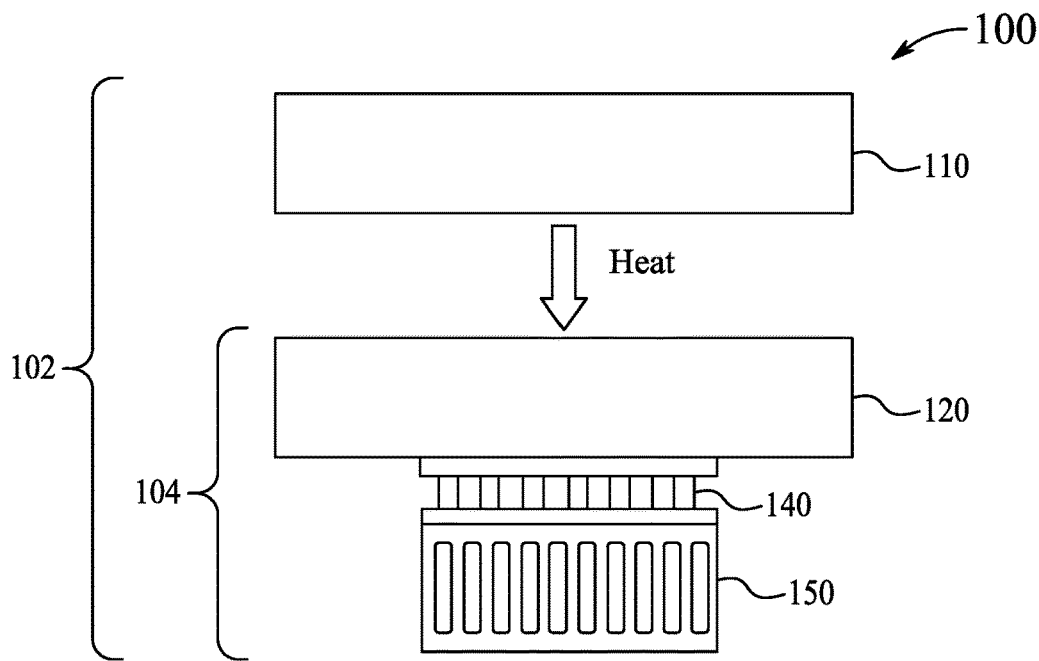
FIG. 5A is a simplified diagram of the thermal management device showing working principle thereof, according to certain embodiments.

Referring to FIG. 5A, illustrated is a simplified diagram of the thermal management device 100 showing the working principle thereof. Herein, some of the components of the thermal management device 100 have been omitted for simplicity. The thermal management device 100 primarily includes four layers, namely the photovoltaic panel 110, the phase change material layer 120, the Seebeck thermoelectric generator 140 and the heat sink 150. The said four layers are attached (integrated) together to form the assembly 102. As seen in FIG. 5A, in an example, the thermal management device 100 may be provided in the form of an integrated system with the assembly 102 of the photovoltaic panel 110, the phase change material layer 120, the Seebeck thermoelectric generator 140 and the heat sink 150. In another possible configuration, the thermal management device 100 may be provided in the form of a module with an assembly 104 of the phase change material layer 120, the Seebeck thermoelectric generator 140 and the heat sink 150 to be utilized for thermal management of the photovoltaic panel 110. Such assembly 104 may be adapted to be utilized with existing photovoltaic panels, thus enabling a modular plug-in and plug-out functionality for thermal management of existing photovoltaic panels.

Figure 5B:
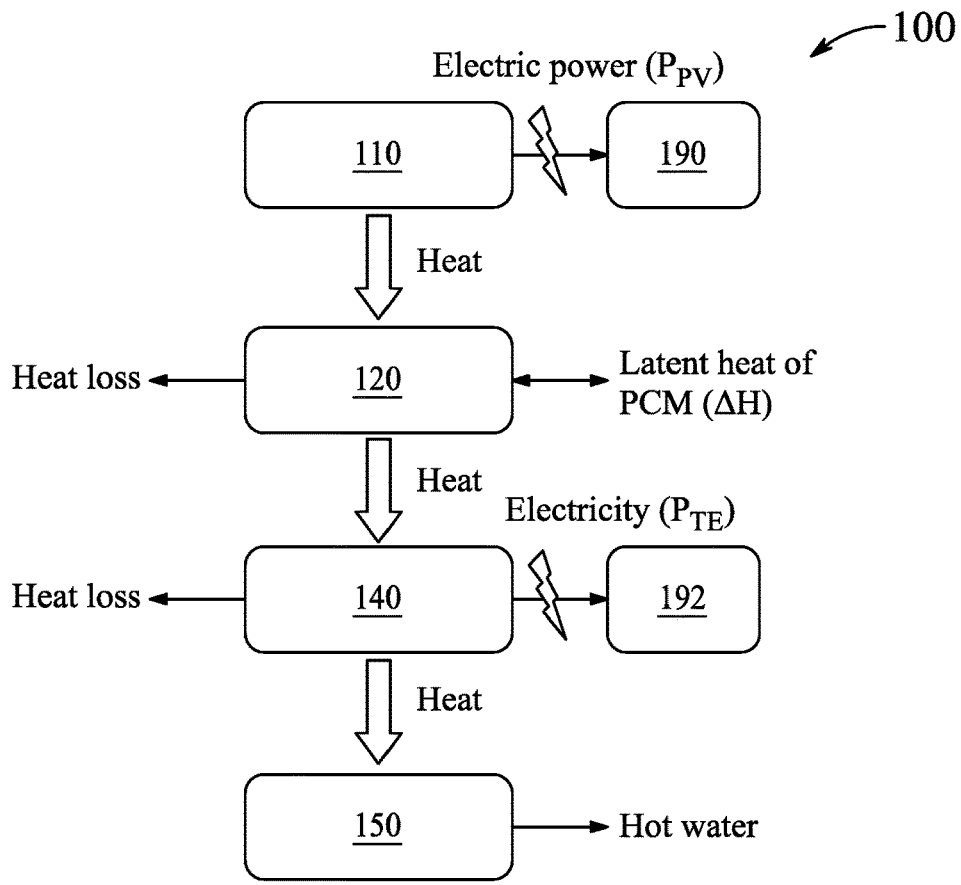
FIG. 5B is a schematic diagram of the thermal management device showing energy flow and energy generation therein, according to certain embodiments.

FIG. 5B is a schematic diagram of the thermal management device 100 showing energy flow and energy generation therein. Herein, some of the components of the thermal management device 100 have been omitted for simplicity. In the assembly 102, the first layer, which is the photovoltaic panel 110, forms a top of the assembly 102 which converts solar radiation to electric power ($P_{PV}$). In this process, heat is drained by the first layer to an aluminum sheet (such as the aluminum sheet 130, not shown in FIG. 5B), from the back side (such as the back side 112*b*, not shown in FIG. 5B) of the photovoltaic panel 110. The second layer, which is the phase change material layer 120, has the PCM (such as the PCM 128, not shown in FIG. 5B), absorbs heat from the aluminum sheet 130 and distributes heat evenly as latent heat ($\Delta H$) throughout a course of time. The third layer, which is the Seebeck thermoelectric generator 140, has thermoelectric generators (TEGs) (such as the TEGs 144, not shown in FIG. 5B) which may utilize the leftover heat that may not be absorbed by the PCM 128 in the phase change material layer 120 for generating electricity ($P_{TE}$), by using the Seebeck principle. The fourth layer, which is the heat sink 150, having water flowing therein helps with dissipating residual surplus heat energy that the TEGs 144 may not be able to utilize for electricity generation. The heated water may be used downstream to operate other appliances/devices, such as a home water heater.

Further, as illustrated in FIG. 5B, the thermal management device 100 includes a first electrical junction box 190 attached (electrically connected) to the photovoltaic panel 110. The first electrical junction box 190 is configured to receive the electric power ($P_{PV}$) generated by the photovoltaic panel 110. The thermal management device 100 also includes a second electrical junction box 192 attached (electrically connected) to the Seebeck thermoelectric generator 140. The second electrical junction box 192 is configured to receive electricity ($P_{TE}$) generated by the Seebeck thermoelectric generator 140. The first electrical junction box 190 and the second electrical junction box 192 may then be used to supply the received electrical energy, from both the photovoltaic panel 110 as well as the Seebeck thermoelectric generator 140, to an electrical grid or the like.

The heat transfer modelling of different phases of the thermal management device 100 is described in the following sections. Below is provided the nomenclature as employed for the said heat transfer modelling.

Nomenclature

A Area ($mm^2$)
C Optical concentration ratio
G Solar radiation ($W/m^2$)
T Temperature (k)
R Thermal resistance ($mm^2$ K/W)
E Electrical energy output ($W/m^2$)
$h_{air}$ Convective heat transfer coefficient of air ($W/mm^2$ K)
$h_w$ Convective heat transfer coefficient of water ($W/mm^2$ K)
$1/h_r$ Radiation thermal resistance ($mm^2$ K/W)
$R_C$ Thermal contact resistance ($mm^2$ K/W)
P Power (W)
$c_p$ Thermal capacity (J/Kg K)
$T_{wo}$ Temperature of water at the outlet (k)
$T_{wi}$ Temperature of water at the inlet (k)
$T_{wm}$ mean temperature of the water (k)
K Thermal conductivity (W/m K)
Nu Nusselt number
$D_h$ The hydraulic diameter of channel (mm)
$A_c$ Cross sectional area of channel ($mm^2$)
t time (s)
u velocity (m/s)
m number of channel
$R_c$ Thermal contact resistance ($mm^2$ K/W)
Ra Rayleigh number
H Latent heat of Phase change material
P Power (W)
$T_m$ Melting temperature of PCM
PV Photovoltaic
$h_g$ Heat transfer coefficient of glass ($W/mm^2$ K)
$h_e$ Convective heat transfer coefficient of PV
ch channel
a air
r radiative
bp base panel
re Reference
mw massive wall
f friction factor
TE Thermoelectric
PCM Phase Change Material
up upside surface
down down side surface amb Ambient
ins insulation
g Glass
S Sky
ρ Density (Kg/m$^3$)
$\delta_{pv}$ Thickness of PV (mm)
$\lambda_{pv}$ wavelength of photon (μm) and Thermal conductivity
τ transmissivity coefficient
α Absorptivity of PV
σ Electrical conductivity coefficient
ε emissivity coefficient
β PV temperature coefficient
η Electrical efficiency (%)
ν Viscosity N s/m$^2$ Numerical Model for the Photovoltaic Panel 110:

The energy equation of the photovoltaic panel 110 is given by Equation (1).

$$\rho_{PV} \cdot c_{PV} \cdot \delta_{PV} \cdot \frac{\partial T_{PV}}{\partial t} = \lambda_{PV}\delta_{PV}\frac{\partial^2 T_{PV}}{\partial y^2} + h_{g,PV}(T_g - T_{PV}) + h_{ca,PV}(T_{a,ch} - T_{PV}) + h_{rbp,PV}(T_{bp} - T_{PV}) + G \cdot \zeta \cdot (\tau\alpha)_{PV} - \zeta \cdot E_{PV} \quad (1)$$

The surface convective heat transfer of the photovoltaic panel 110 is expressed by Equation (2).

$$h_{ca,PV} = \frac{Nu_{a,ch} \cdot \lambda_a}{D_{ch}} \quad (2)$$

The surface radiative heat transfer of the photovoltaic panel 110 is expressed by Equation (3).

$$h_{rbp,PV} = \sigma\left(T_{bp}^2 + T_{PV}^2\right) \cdot (T_{bp} + T_{PV}) \cdot \frac{1}{1/\varepsilon_b + 1/\varepsilon_{PV} - 1} \quad (3)$$

The difference in temperature between the channel wall and the air inside the channel, with the air channel, means characteristic temperature value can be calculated using the following equations:

$$\frac{T_{PV} + T_{bp}}{2} - T_{a,ch} = \theta\left(T_{a,ch} + (T_{PV} + T_{bp})/2\right)/2 = T_m \quad (4)$$

Natural convection in the vertical channel with open vents can be empirically calculated using Equation (5).

$$Nu_{a,ch} = \frac{1}{24}Ra_{a,ch}\left(\frac{D_{ch}}{H_{ch}}\right)\left\{1 - \exp\left[-\frac{35}{Ra_{a,ch}D_{ch}/H_{ch}}\right]\right\}^{3/4} \quad (5)$$

The thermal resistance and thermal expansion of the channel can be calculated using the following equations:

$$Ra_{a,ch} = \frac{g \cdot \beta_{a,ch} \Delta T \cdot D_{ch}^3}{a \cdot v}, \quad \beta_{a,ch} = \frac{2}{T_m} \quad (6)$$

The power output of the photovoltaic panel 110 can be expressed by Equation (7).

$$E_{PV} = G \cdot (\tau\alpha)_{PV} \cdot \eta_{re} \cdot [1 - 0.0045 \cdot (T_{PV} - T_{re})] \quad (7)$$

The effective absorptance of the photovoltaic panel 110 can be calculated using Equation (8).

$$(\tau a)_{PV} = \frac{\tau_g \alpha}{1 - (1 - \alpha)\rho_g} \quad (8)$$

where α is the weighted average PV cell absorptances and EVA adhesive can be expressed by Equation (9).

$$\alpha = \zeta \cdot \alpha_{PV} + (1 - \zeta) \cdot \alpha_{EVA} \quad (9)$$

Numerical Model for the Glass Cover 180:

The energy balance equation for the glass cover does not include the heat capacity of glass due to the negligibly small thickness of the glass cover 180. The equation obtained is expressed as indicated in Equation (10).

$$\rho_g c_g \delta_g \cdot \frac{dT_g}{dt} = h_{e,g}(T_e - T_g) + h_{s,g}(T_s - T_g) + h_{PV,g}(T_{PV} - T_g) + G \cdot a_g \quad (10)$$

The sky temperature can be expressed in terms of the environmental temperature as indicated by Equation (11).

$$T_s = 0.0552 \cdot T_e^{1.5} \quad (11)$$

The convective heat transfer between the glass cover 180 and the environment can be expressed by Equation (12).

$$h_{co} = 2.8 + 3.0 u_w \quad (12)$$

The radiative heat transfer between the glass cover 180 and the environment can be expressed by Equation (13).

$$h_{ra} = V_g \sigma (T_s^2 + T_g^2)(T_s + T_3) \quad (13)$$

The heat transfer between the photovoltaic panel 110 and the glass cover 180 can be expressed by Equation (14).

$$h_{PV,g} = h_{g,PV} = 1/(\delta_{EVA}/\lambda_{EVA}) \quad (14)$$

The Nusselt number of the closed air cavity can be expressed by Equation (15).

$$Nu = \max\left\{1, 0.288 \cdot \left(\frac{Ra}{K_G}\right)^{0.25}, 0.039 R_a^{0.33}\right\} \quad (15)$$

The Rayleigh number can be calculated using Equation (16).

$$Ra = \frac{g \cdot \beta \cdot (T_{PV} - T_g)}{a \cdot v} \quad (16)$$

The thermal expansion can be calculated using Equation (17).

$$\beta = \frac{2}{T_{PV} + T_g} \quad (17)$$

Numerical Model for the Casing Box 170:

The energy balance equation of the casing box 170 (absorber base panel) is expressed by Equation (18).

$$\rho_{bp} \cdot c_{bp} \cdot \delta_{bp} \cdot \frac{\partial T_{bp}}{\partial t} = \lambda_{bp}\delta_{bp}\frac{\partial^2 T_{bp}}{\partial y^2} + h_{rbp,PV}(T_{PV} - T_{bp}) + \quad (18)$$

-continued $$h_{ca,bp}(T_{a,ch} - T_{bp}) + G \cdot (1 - \zeta) \cdot \tau_g \cdot \tau_{EVA} \cdot \alpha_{bp} + \frac{(T_{mw} - T_{bp})}{R_{mw,bp}}$$

The thermal resistance of the massive wall and the base panel is expressed by Equation (19).

$$R_{mw,bp} = \delta_{ins}/\lambda_{ins} \tag{19}$$

The surface convective heat transfer of the base panel is expressed by Equation (20).

$$h_{ca,bp} = Nu_{a,ch} \cdot \lambda_d/D_{ch} \tag{20}$$

The overall heat transfer is expressed by following equations.

$$CGA_{PV} = \frac{A_{PV}(T_{PV-UP} - T_{PV-down})}{R_{PV}} + P_{PV} + \tag{21}$$

$$A_{PV}(T_{PV-up} - T_{amb})h_r(T_{PV-up}) + A_{PV}h_{air}(T_{PV-up} - T_{amb})$$

$$A_{PV}(T_{PV-down} - T_{PCM-up})/R_C1 = A_{PCM}(T_{PCM-up} - T_{PCM-down})/R_{PCM} + E_{PCM} + (A_{PCM} - A_{PV})(T_{PCM-up} - T_{amb})(h + (T_{PCM-up}) + h_{air}) \tag{22}$$

$$A_{PCM}(T_{PCM-up} - T_{PCM-down})/R_{PCM} = A_{TE}(T_{PCM-down} - T_{TE-up})/R_C2 + (A_{PCM} - A_{TE})(T_{PCM-down} - T_{amb})(h_r(T_{PCM-down}) + h_{air}) \tag{23}$$

$$A_{TE}(T_{PCM-down} - T_{TE-up})/R_C2 = A_{TE}(T_{TE-up} - T_{TE-down})/R_{TE} + P_{TE} \tag{24}$$

$$A_{TE}(T_{TE-down} - T_{hs-up})/R_C3 = A_{hs}(T_{hs-up} - T_{hs-down})/R_{hs} = h_w(T_{hs-down} - T_{wm})(2a+2b)lm = \rho_w C_{p-water} \mu_w m A_c(T_{wo} - T_{wi}) \tag{25}$$

$$h_r(T) = \varepsilon_{PV}(T^2 + T_{amb}^2)(T + T_{amb}) \tag{26}$$

$$\eta(t) = (P_{PV}(t) + P_{TE}(t) - P_{pump}(t))/CG(t)A_{Pv} \tag{27}$$

$$\eta = \frac{\sum (P_{PV}(t) + P_{TE}(t) - P_{pump}(t))\Delta t}{\sum CG(t)A_{PV}\Delta t} \tag{28}$$

$$P_{TE} = \eta_{TE}A_{TE}(T_{PCM-down} - T_{TE-up})/R_{c2} \tag{29}$$

$$h_w = k_w Nu/D_h \tag{30}$$

$$P_{pump} = f \times \frac{l}{D_h} \times \frac{\mu_w^2}{2} \times \rho_w \times A_c \times \mu_w \times m \tag{31}$$

Figure 6:
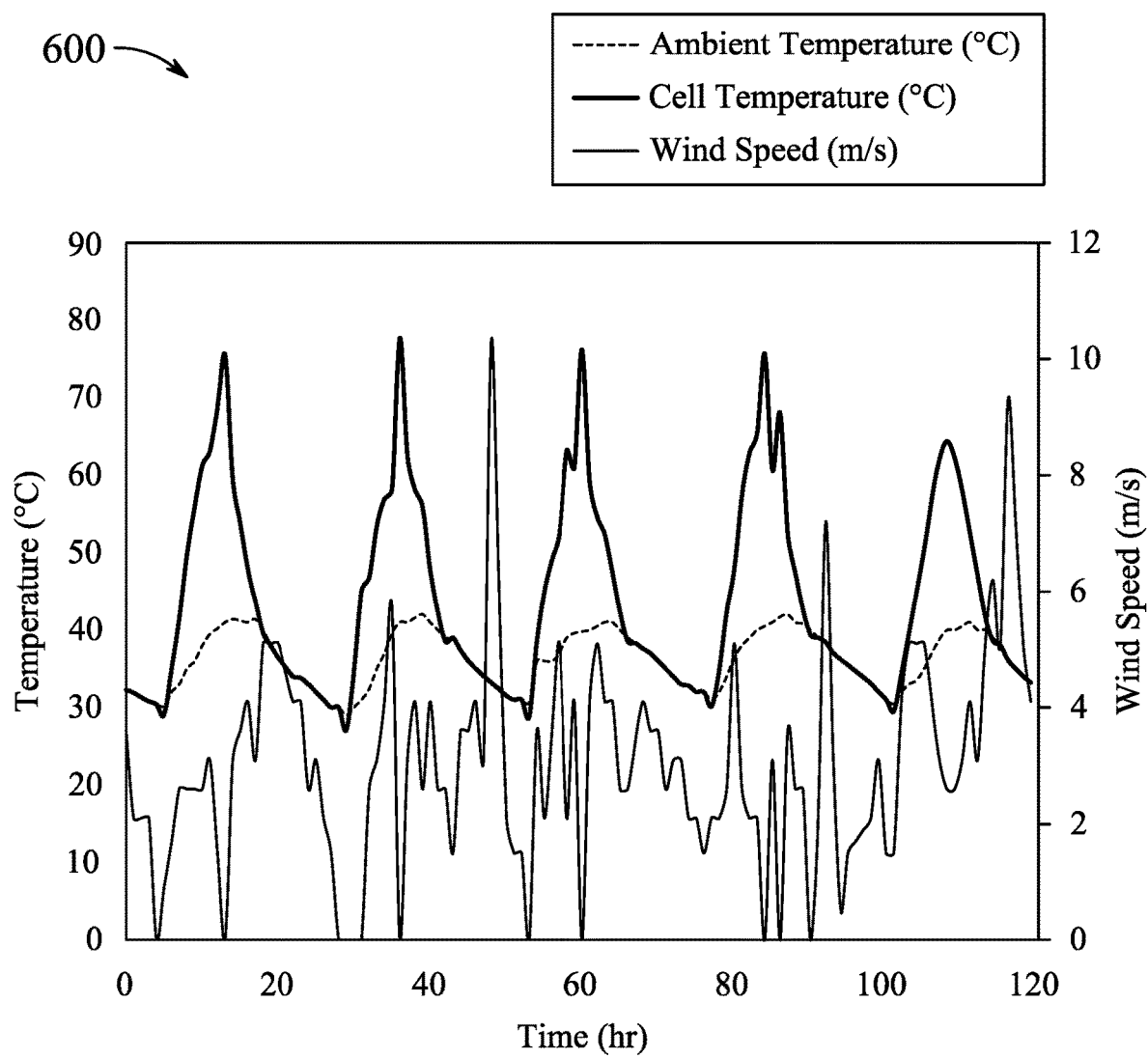
FIG. 6 is an exemplary graph showing hourly variation in temperature of a photovoltaic panel with change in ambient temperature and wind speed, according to certain embodiments.
Figure 7:
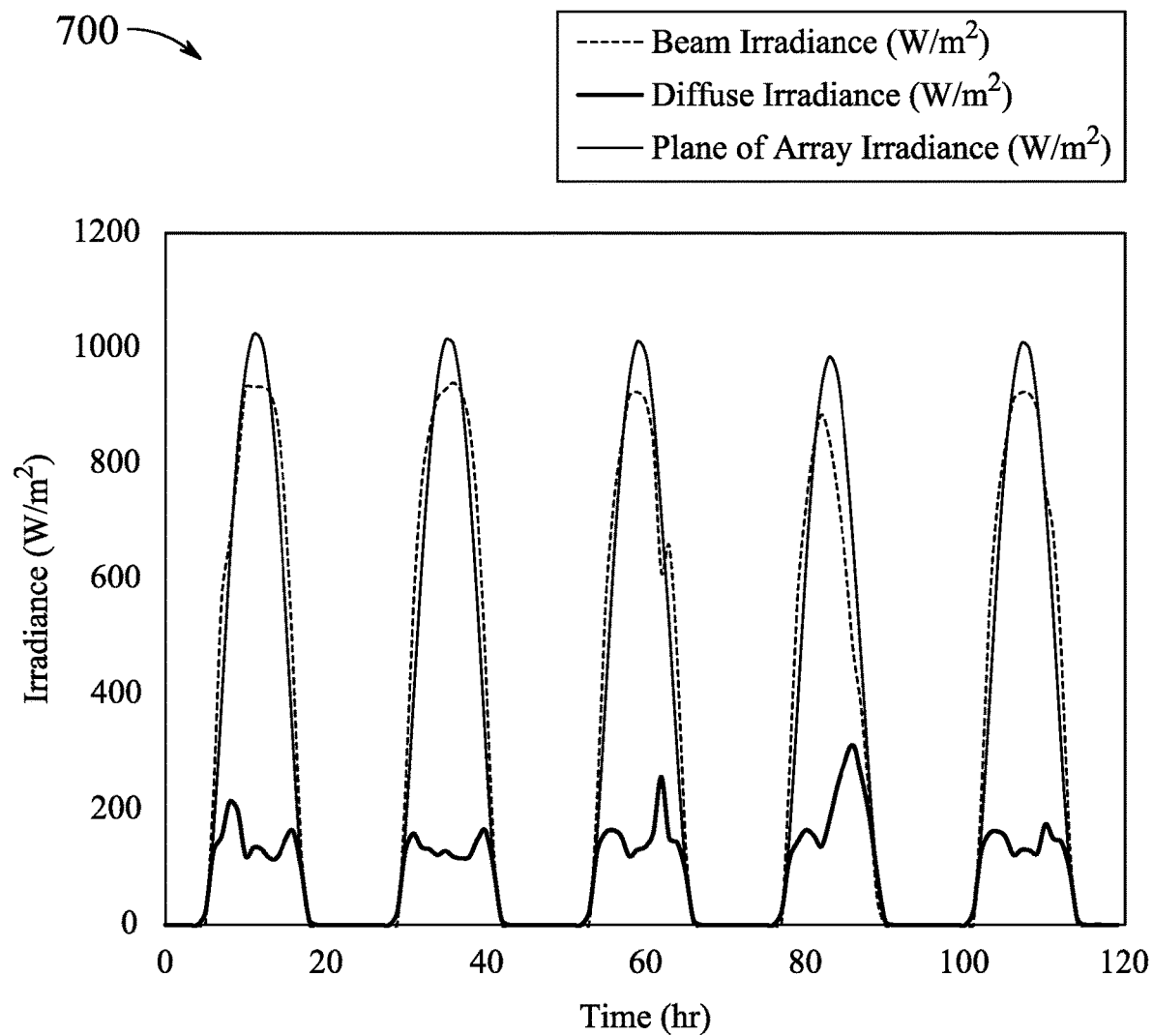
FIG. 7 is an exemplary graph showing hourly variation of solar irradiance with time, according to certain embodiments.

Based on the numerical modeling described above, a simulation model was developed. The weather climatic condition used in the simulation is of Dhahran, Easter province, Saudi Arabia. FIG. 6 is an exemplary graph 600 showing hourly variation in temperature of a photovoltaic panel with change in ambient temperature and wind speed. The graph 600 provides a five day hourly variation of real climatic data. Further, FIG. 7 is an exemplary graph 700 showing hourly variation of solar irradiance with time, i.e., the solar irradiance variation with time for Dhahran climatic conditions.

Figure 8:
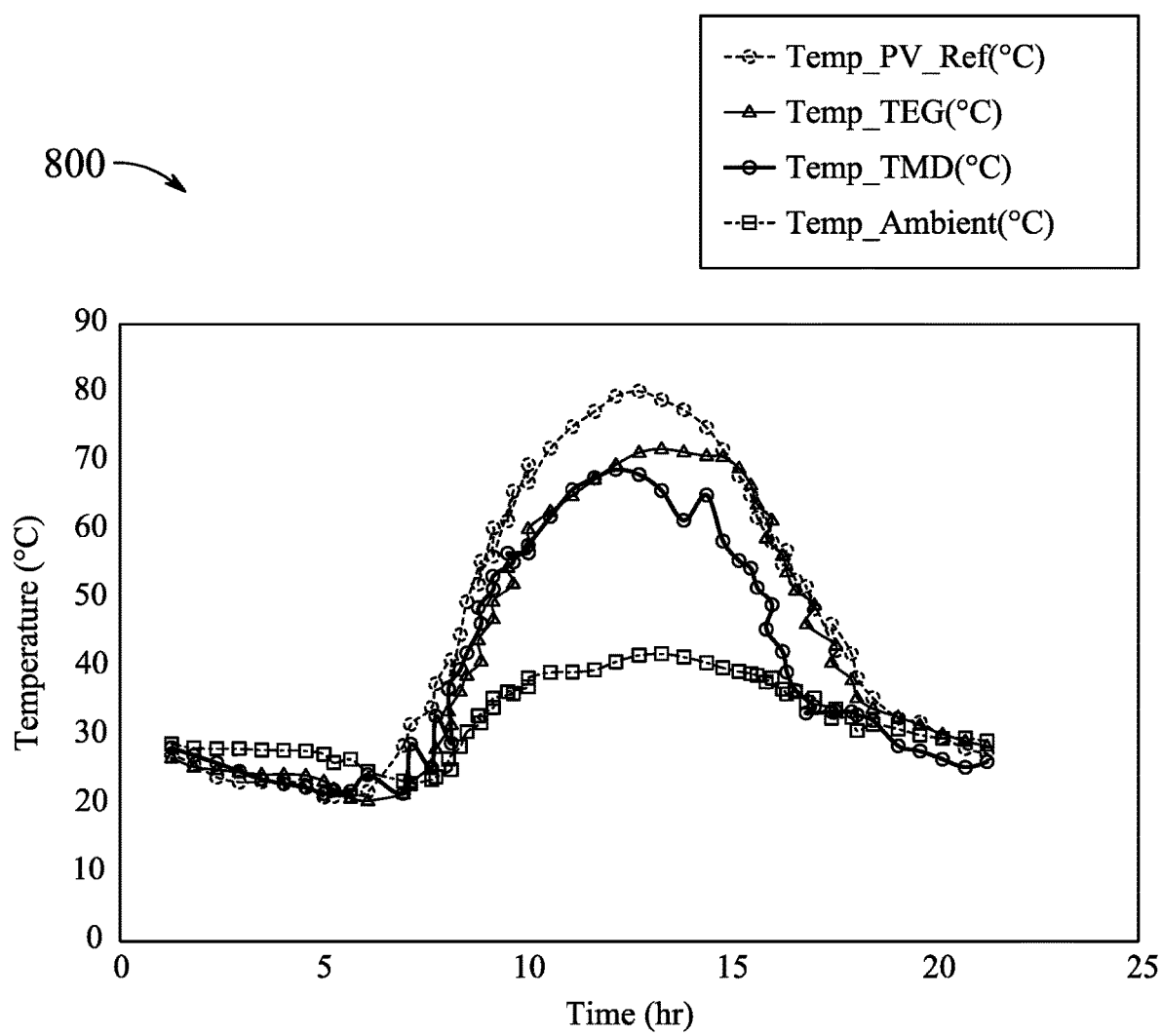
FIG. 8 is an exemplary graph showing hourly variation in temperature of a reference photovoltaic panel, a photovoltaic panel with Seebeck thermoelectric generator and a photovoltaic panel associated with the thermal management device based on change in ambient temperature, according to certain embodiments.

FIG. 8 is an exemplary graph 800 showing hourly variation in temperature of a reference photovoltaic panel (referred to as Temp_PV_Ref in the legend of FIG. 8), a photovoltaic panel with a thermoelectric generator (referred to as Temp_TEG in the legend of FIG. 8) and the photovoltaic panel 110 (referred to as Temp_TMD in the legend of FIG. 8) associated with the thermal management device 100 based on change in ambient temperature (referred to as Ambient in the legend). As may be seen, in comparison to the reference photovoltaic panel, the temperature was reduced by directly connecting the photovoltaic panel with thermoelectric generators (TEGs) as a heat sink. Furthermore, when compared to the other two systems, the present thermal management device 100 resulted in a greater reduction in temperature of the associated photovoltaic panel 110. When the maximum temperature of the reference photovoltaic panel reached 80.2° ° C. during the peak of solar radiation, the temperature of the photovoltaic panel with thermoelectric generators fell by approximately 9.3° C. Herein, using the TMD 100 reduces the temperature of the photovoltaic panel 110 by 21.2° C. compared to the reference photovoltaic panel temperature and 13.3° C. compared to the photovoltaic panel with thermoelectric generators during peak sun-hour.

Figure 9:
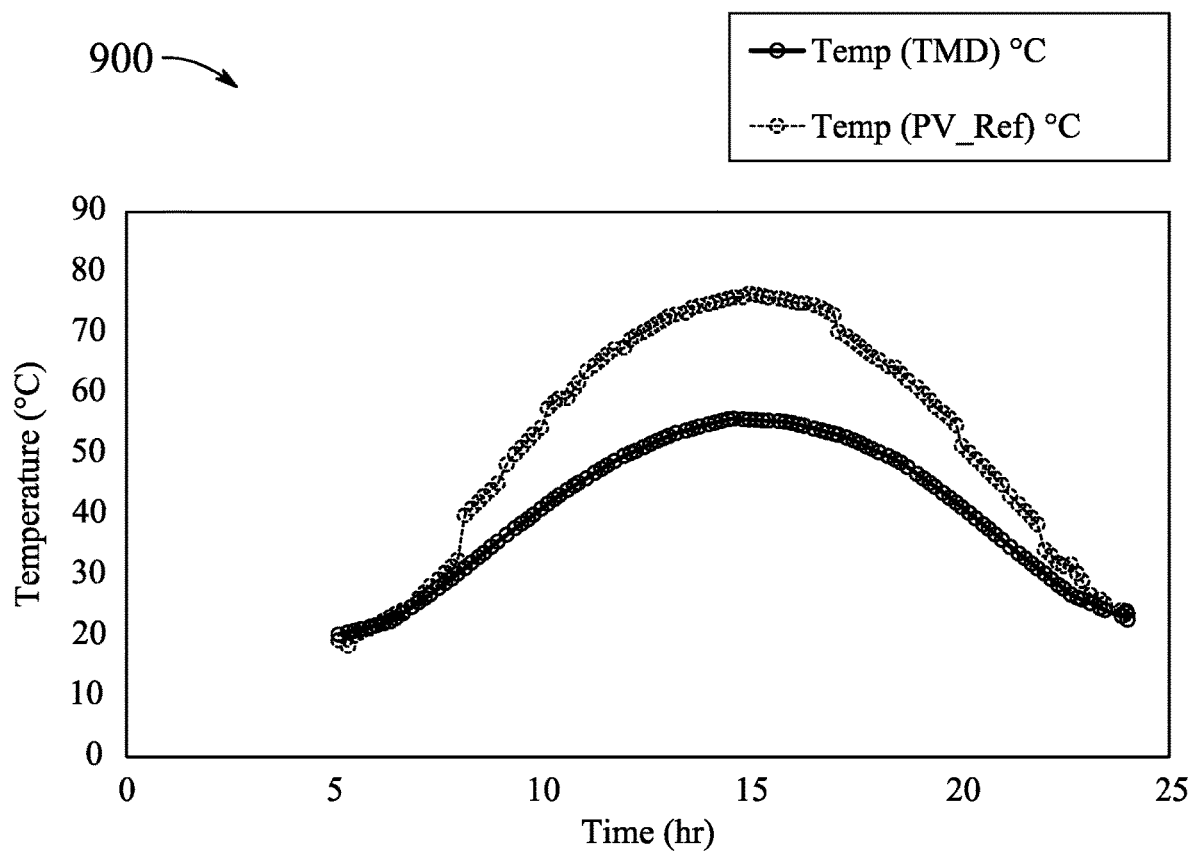
FIG. 9 is an exemplary graph showing hourly variation in temperature of a reference photovoltaic panel and a photovoltaic panel associated with the thermal management device, according to certain embodiments.

FIG. 9 is an exemplary graph 900 showing hourly variation in temperature of a reference photovoltaic panel (referred to as Temp_PV_Ref in the legend of FIG. 9) and the photovoltaic panel 110 associated with the thermal management device (referred to as Temp_TMD in the legend of FIG. 9) 100. The graph 900 shows the effect on temperature of the photovoltaic panel 110 by integrating the TMD 100 therewith. It may be observed that the TMD 100 can reduce temperature of the photovoltaic panel 110 by as much as 20° C. as compared to temperature of a reference photovoltaic panel.

Figure 10:
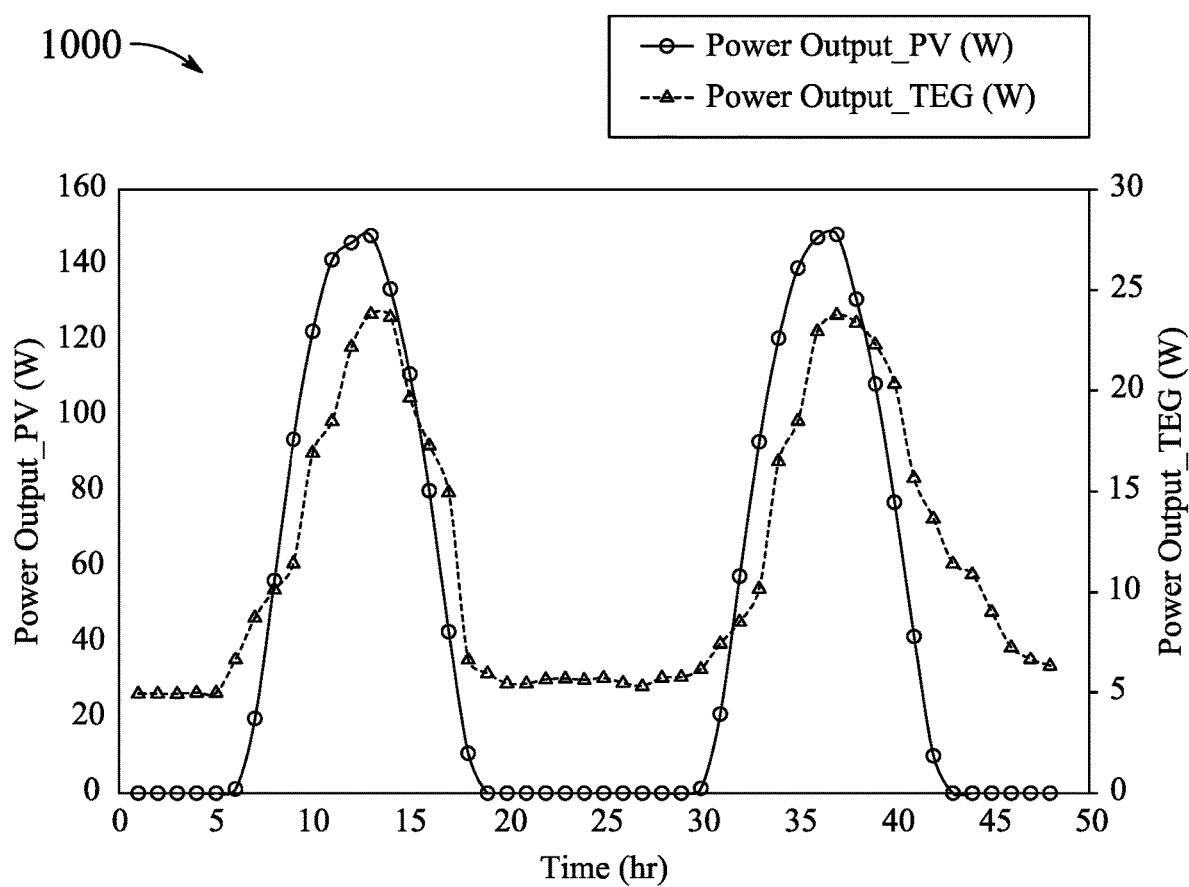
FIG. 10 is an exemplary graph showing hourly variation of power output by a photovoltaic panel and a Seebeck thermoelectric generator of the thermal management device, according to certain embodiments.

FIG. 10 is an exemplary graph 1000 showing hourly variation of power output by the photovoltaic panel 110 and the Seebeck thermoelectric generator 140 of the thermal management device 100. It was observed that as solar irradiance increased during the day, both the photovoltaic panel 110 and the Seebeck thermoelectric generator 140 produced more energy. The Seebeck thermoelectric generator 140 generated more energy because there is a greater temperature difference between two surfaces during the day, when solar irradiance is at its maximum. As solar radiation diminished and eventually reached zero at nighttime, the power produced by photovoltaic panel 110 diminished and eventually reached zero; however, due to the temperature difference between two surfaces maintained by the phase change material layer 120, power production from the Seebeck thermoelectric generator 140 continued.

Figure 11:
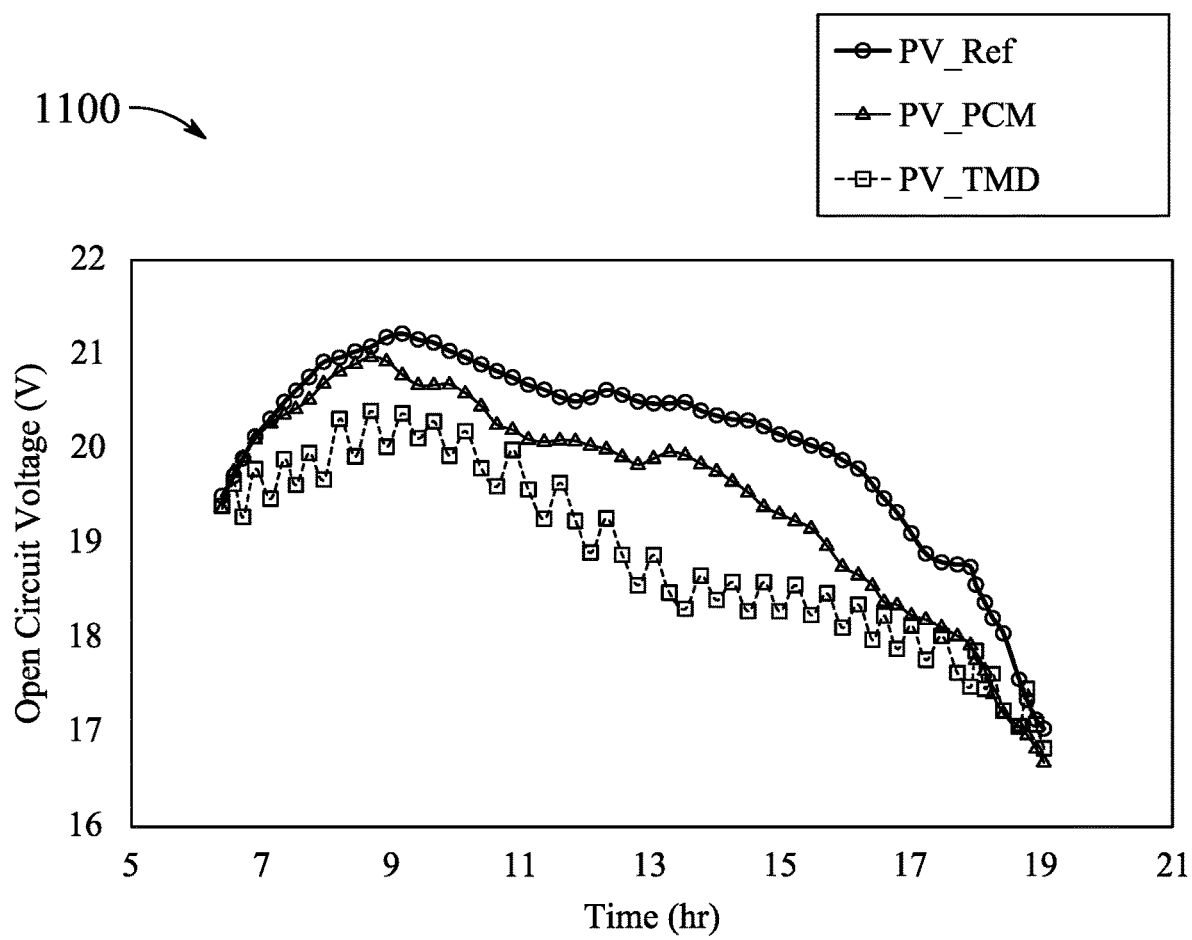
FIG. 11 is an exemplary graph showing hourly variation in open circuit voltage for a reference photovoltaic panel, a photovoltaic panel with phase change material and a photovoltaic panel associated with the thermal management device, according to certain embodiments.

FIG. 11 is an exemplary graph 1100 showing hourly variation in open circuit voltage for a reference photovoltaic panel (referred to as PV_Ref in the legend of FIG. 11), a photovoltaic panel with phase change material (referred to as PV_PCM in the legend of FIG. 11) and the photovoltaic panel 110 associated with the thermal management device 100 (referred to as PV_TMD in the legend of FIG. 11). As may be seen from the graph 1100, there was an increase in open circuit voltage caused by an increase in solar radiation between 8 a.m. and 11 a.m. Additionally, as may be seen in the graph 1100, the open circuit voltage of the reference photovoltaic panel was always less than the open circuit voltage of the photovoltaic panel with phase change material, which in turn was less than the photovoltaic panel 110 associated with the thermal management device 100. This is because the temperature of the photovoltaic panel 110 integrated with the thermal management device 100 is always lower than the temperature of the other two, thus increasing its efficiency.

Figure 12:
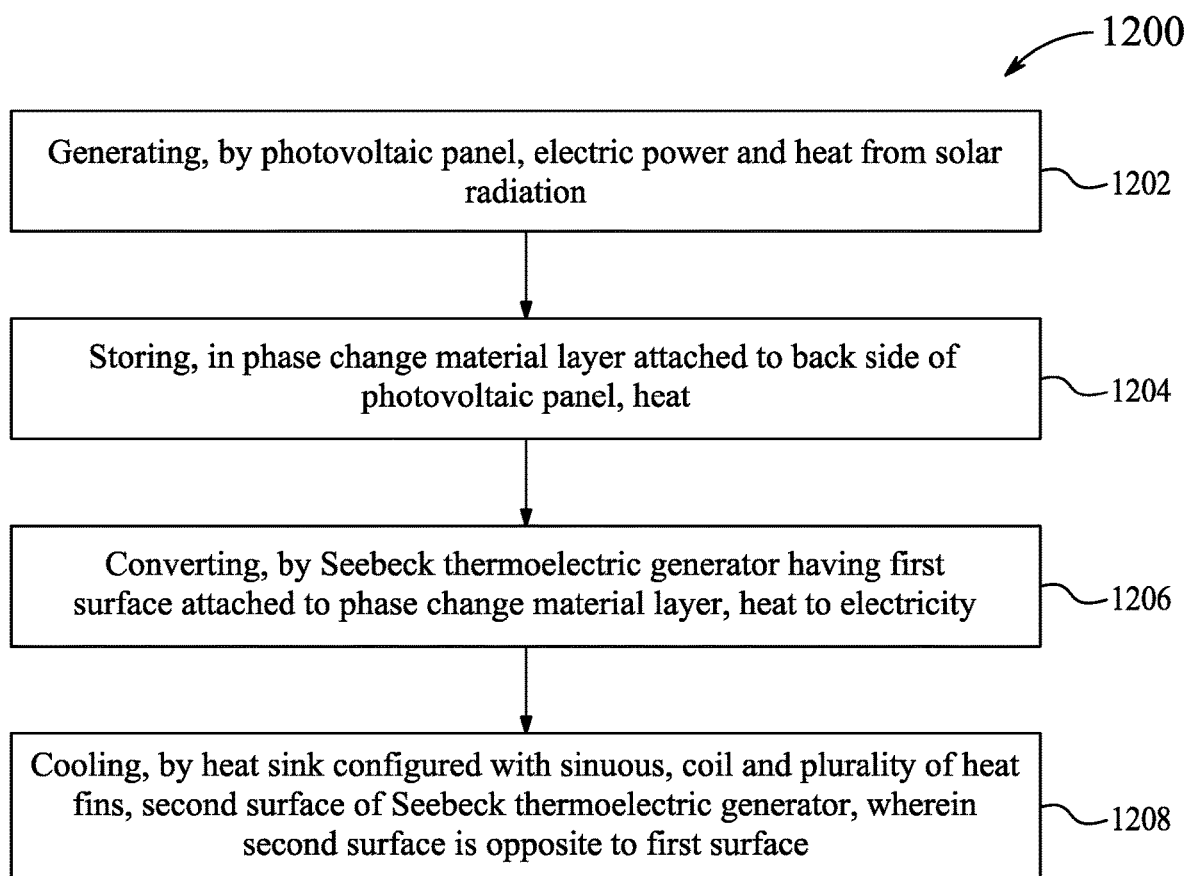
FIG. 12 is an exemplary flowchart of a method for thermal management of a photovoltaic panel, according to certain embodiments.

Referring to FIG. 12, illustrated is an exemplary flowchart of a method (represented by reference numeral 1200) for thermal management of the photovoltaic panel 110. At step 1202, the method 1200 includes generating, by the photovoltaic panel 110, electric power and heat from solar radiation. At step 1204, the method 1200 includes storing, in the phase change material layer 120 attached to the back side 112b of the photovoltaic panel 110, the heat. At step 1206, the method 1200 includes converting, by the Seebeck thermoelectric generator 140 having the first surface 142a attached to the phase change material layer 120, the heat to electricity. Herein, the method 1200 includes converting, by the Seebeck thermoelectric generator 140, the heat to the electricity by utilizing the temperature gradient between the first surface 142a and the second surface 142b. At step 1208, the method 1200 includes cooling, by the heat sink 150 configured with the sinuous coil 152 and the plurality of heat fins 154, the second surface 142b of the Seebeck thermoelectric generator 140, in which the second surface 142b is opposite to the first surface 142a. Herein, the method 1200 includes pumping, with the water pump 164, the water volume in the sinuous coil 152 to and from the water reservoir 162.

The method 1200 further includes receiving, by the first electrical junction box 190 attached to the photovoltaic panel 110, the electric power generated by the photovoltaic panel 110. The method 1200 also includes receiving, by the second electrical junction box 192 attached to the Seebeck thermoelectric generator 140, the electricity generated by the Seebeck thermoelectric generator 140.

The method 1200 further includes enclosing the back and sides of the assembly 102 of the photovoltaic panel 110, the phase change material layer 120, the Seebeck thermoelectric generator 140 and the heat sink 150 in the casing box 170. The method 1200 also includes installing the phase change material liner 174 in the casing box 170. The method 1200 also includes removing heat from the plurality of heat fins 154 by storing heat in the phase change material liner 174.

Figure 13:
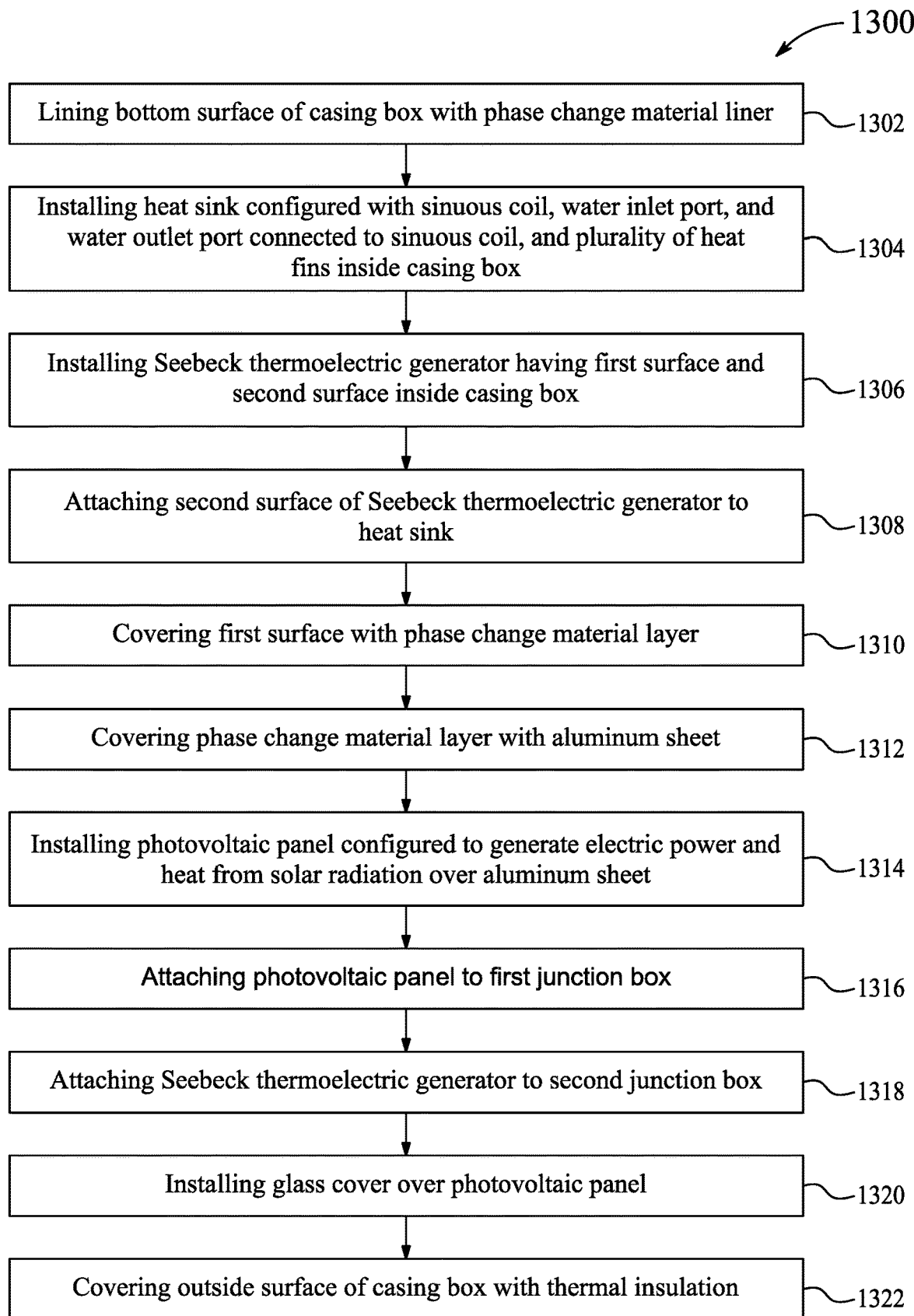
FIG. 13 is an exemplary flowchart of a method of assembling the thermal management device, according to certain embodiments.

Referring to FIG. 13, illustrated is the exemplary flowchart of the method (represented by reference numeral 1300) of assembling the thermal management device 100. At step 1302, the method 1300 includes lining the bottom surface 172 of the casing box 170 with the phase change material liner 174. At step 1304, the method 1300 includes installing the heat sink 150 configured with the sinuous coil 152, the water inlet port 158a and the water outlet port 158b connected to the sinuous coil 152, and the plurality of heat fins 154 inside the casing box 170. At step 1306, the method 1300 includes installing the Seebeck thermoelectric generator 140 having the first surface 142a and the second surface 142b inside the casing box 170. At step 1308, the method 1300 includes attaching the second surface 142b of the Seebeck thermoelectric generator 140 to the heat sink 150. At step 1310, the method 1300 includes covering the first surface 142a with the phase change material layer 120. Herein, the method 1300 includes forming the phase change material 128 of the phase change material layer 120 and the phase change material liner 174 by dissolving the mixture of polyethylene glycol (PEG) and magnesium carbonate (MgCaCO$_3$) in ethanol and solidifying the mixture by evaporation. At step 1312, the method 1300 includes covering the phase change material layer 120 with the aluminum sheet 130. At step 1314, the method 1300 includes installing the photovoltaic panel 110 configured to generate electric power and heat from solar radiation over the aluminum sheet 130. At step 1316, the method 1300 includes attaching the photovoltaic panel 110 to the first electrical junction box 190. At step 1318, the method 1300 includes attaching the Seebeck thermoelectric generator 140 to the second electrical junction box 192. At step 1320, the method 1300 includes installing the glass cover 180 over the photovoltaic panel 110. At step 1322, the method 1300 includes covering the outside surface 179 of the casing box 170 with thermal insulation.

In some aspects, the method 1300 further includes connecting the water pump 164 between the water inlet port 158a and the water reservoir 162. The method 1300 also includes connecting the water pipe 166 between the water outlet port 158b and the water reservoir 162. The method 1300 also includes connecting the water pump 164 to the source of power (such as, but not limited to, electrical supply). The method 1300 also includes cooling the second surface 142b by pumping, with the water pump 164, water through the sinuous coil 152.

The thermal management device 100 of the present disclosure utilizes a combination of the phase change material layer 120, the Seebeck thermoelectric generator 140 to convert waste heat from the photovoltaic panel 110 into usable electricity. The operation of the thermal management device 100 is based on the assumption that when a part of the solar spectrum is used by the photovoltaic panel 110 to produce energy, the remaining solar spectrum is converted into heat and consumed by the phase change material layer 120, resulting in temperature increase and phase shift of the PCM 128 therein. Using the Seebeck principle, leftover heat from the phase change material layer 120 is transferred to the Seebeck thermoelectric generator 140 for electricity generation. The residual surplus heat energy that the Seebeck thermoelectric generator 140 cannot use is eventually transferred to the heat sink 150 and absorbed by water flowing therein, to be dissipated or re-used. The composites PCM 128, as used in the present thermal management device 100, compared to traditional stabilized PCMs provides better efficiency in storage of heat for delivery to the Seebeck thermoelectric generator 140. The PCM 128 unlocks the accumulated power by adjusting the reverse process of diminishing nighttime solar radiation. Generally, in nighttime, the energy production of the photovoltaic panel 110 is significantly reduced, however, due to the heat stored in the phase change material layer 120, the Seebeck thermoelectric generator 140 can continue to produce electricity. The phase change material layer 120 and the Seebeck thermoelectric generator 140 therefore plays the function of storing heat energy and sustaining a working temperature for the hybrid system within specification, as provided by the thermal management device 100. Initial preliminary result shows that integration of the present thermal management device 100 with the photovoltaic panel 110 increases panel efficiency by 15-20% with panel temperature reduction by 18 to 25° C.

The thermal management device 100 of the present disclosure has multiple benefits including no external electrical power requirement for its operation, compact in size, easily plug-in and plug-out option, waste heat conversion into electrical energy and hot water, day and night electrical energy production, and high reliability. The thermal management device has wide application areas such as thermal management of PV panels, batteries, solar collectors, industrial waste heat recovery, HVAC system, hybrid vehicles etc.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. An integrated thermal management device with PV panel, comprising:
   a photovoltaic panel configured to convert solar radiation to electric power;
   a phase change material layer attached to a back side of the photovoltaic panel;
   wherein the photovoltaic panel is removably attached to the thermal management device via the phase change material layer:
   wherein a phase change material of the phase change material layer comprises polyethylene glycol (PEG) and magnesium doped calcium carbonate (MgCaCO$_3$), and
   wherein magnesium is present in the MgCaCO$_3$ at a concentration of 5 to 15 mole percent (mol %) based on the total moles of the MgCaCO$_3$;
   a Seebeck thermoelectric generator having a first surface attached to the phase change material layer;
   a heat sink attached to a second surface of the Seebeck thermoelectric generator, wherein the heat sink is configured with a sinuous coil, a water inlet port and a water outlet port connected to the sinuous coil, a fan, an exit port and a plurality of heat fins;
   a casing box configured to enclose a back and sides of an assembly of the photovoltaic panel, the phase change material layer, the Seebeck thermoelectric generator and the heat sink; and
   a glass cover configured to cover a top surface of the photovoltaic panel, wherein the glass cover is attached to the casing box,
   wherein the photovoltaic panel, the phase change material layer, the Seebeck thermoelectric generator and the heat sink are directly integrated to form the assembly.

2. The thermal management device of claim 1, wherein the phase change material layer is prepared from a mixture of polyethylene glycol (PEG) having an average molecular weight (Mw) of about 6000 grams per mole (g/mol), magnesium doped calcium carbonate (MgCaCO$_3$), and ethanol.

3. The thermal management device of claim 2, wherein the phase change material layer comprises:
   a copper housing having an outside surface surrounded by thermal insulation; and
   a phase change material configured to line an inside of the copper housing.

4. The thermal management device of claim 1, further comprising:
   a water reservoir;
   a water pump connected at a first end to the water reservoir and at a second end to the water inlet port; and
   a water pipe connected to the water outlet port, wherein the water pump is configured to pump water from the water reservoir, through the sinuous coil and back to the water reservoir.

5. The thermal management device of claim 1, wherein the heat sink includes a plate including the sinuous coil and the plurality of heat fins are extending perpendicularly from the plate.

6. The thermal management device of claim 1, further comprising:
   a first electrical junction box attached to the photovoltaic panel, wherein the first electrical junction box is configured to receive the electric power generated by the photovoltaic panel; and
   a second electrical junction box attached to the Seebeck thermoelectric generator, wherein the second electrical junction box is configured to receive electricity generated by the Seebeck thermoelectric generator.

7. The thermal management device of claim 1, wherein the casing box is made of aluminum.

8. The thermal management device of claim 1, wherein the casing box is made of aluminum, and a bottom surface of the casing box includes a phase change material liner.

9. The thermal management device of claim 1, wherein heat is generated at the back side of the photovoltaic panel in the conversion of the solar radiation to the electric power.

10. The thermal management device of claim 9, further comprising:
    an aluminum sheet connected between the back side of the photovoltaic panel and the phase change material layer, wherein the aluminum sheet is configured to evenly distribute the heat generated by the photovoltaic panel.

11. The thermal management device of claim 10, wherein the phase change material layer is configured to store the heat.

12. The thermal management device of claim 11, wherein the Seebeck thermoelectric generator is configured to receive the heat stored in the phase change material at the first surface and convert the heat to electricity by utilizing a temperature gradient between the first surface and the second surface, wherein the second surface is opposite to the first surface.

13. The thermal management device of claim 1, wherein a weight ratio of the PEG to the MgCaCO$_3$ present in the phase change material is about 5:2.

14. The thermal management device of claim 1, wherein the magnesium is present in the MgCaCO$_3$ at a concentration of 10 mol % based on the total moles of the MgCaCO$_3$, and wherein the phase change material has a melting point in a range of 36 to 55 degree Celsius (° C.).

15. The thermal management device of claim 1, wherein the phase change material layer has a volume expansion of up to 5 vol. % based on an initial volume of the phase change material layer after about 200 thermal heating and cooling cycles.

16. The thermal management device of claim 1, wherein the phase change material layer is a continuous layer of the phase change material, and is directly adjacent to the back side of the photovoltaic panel, and wherein the phase change material layer and the photovoltaic panel have the same length and width.

17. The thermal management device of claim 1, wherein a layer of an aluminum sheet, having the same length and width as the phase change material layer and the photovoltaic panel, is directly adjacent to both the back side of the photovoltaic panel and a front surface of the phase change material layer.

* * * * *